(12) United States Patent
Choung et al.

(10) Patent No.: US 10,439,160 B2
(45) Date of Patent: Oct. 8, 2019

(54) DISPLAY DEVICE

(71) Applicant: Samsung Display Co., Ltd., Yongin-si (KR)

(72) Inventors: Jiyoung Choung, Yongin-si (KR); Arong Kim, Yongin-si (KR); Yeonhwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/811,979

(22) Filed: Nov. 14, 2017

(65) Prior Publication Data
US 2018/0138441 A1 May 17, 2018

(30) Foreign Application Priority Data

Nov. 15, 2016 (KR) ........................ 10-2016-0152241

(51) Int. Cl.
*H01L 51/52* (2006.01)
*H01L 27/32* (2006.01)
*H01L 51/50* (2006.01)
*H01L 51/56* (2006.01)
*G09G 3/3233* (2016.01)

(52) U.S. Cl.
CPC ...... *H01L 51/5228* (2013.01); *H01L 27/3246* (2013.01); *H01L 51/5012* (2013.01);
(Continued)

(58) Field of Classification Search
CPC ............. H01L 51/5256; H01L 51/5228; H01L 51/5212; H01L 51/5206;
(Continued)

(56) References Cited

U.S. PATENT DOCUMENTS 8,846,301 B2 9/2014 Ober et al.
8,871,545 B2 10/2014 Lee et al.
(Continued)

FOREIGN PATENT DOCUMENTS

EP  2927985  10/2015
KR  10-2012-0044876  5/2012
(Continued)

OTHER PUBLICATIONS

Extended European Search Report dated Apr. 17, 2018, in European Patent Application No. 17200505.0.

*Primary Examiner* — Changhyun Yi
(74) *Attorney, Agent, or Firm* — H.C. Park & Associates, PLC

(57) ABSTRACT

A display device includes: a substrate including a first pixel area (PA) and a second PA, the first PA being spaced apart from the second PA by a non-PA; a first pixel electrode (PE) overlapping the first PA; a second PE overlapping the second PA; a pixel-defining layer including a first opening overlapping the first PE and a second opening overlapping the second PE; a first intermediate layer (IL) on the first PE, the first IL including a first emission layer (EL); a second IL on the second PE, the second IL including a second EL spaced apart from the first EL; a first opposite electrode (OE) on the first IL; a second OE on the second IL, the second OE being spaced apart from the first OE; and a wiring layer (WL) overlapping the non-PA, the WL contacting respective portions of the first OE and the second OE.

22 Claims, 34 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5206* (2013.01); *H01L 51/5225* (2013.01); *H01L 51/5237* (2013.01); *H01L 51/56* (2013.01); *G09G 3/3233* (2013.01); *G09G 2300/0426* (2013.01); *G09G 2300/0809* (2013.01); *H01L 27/3279* (2013.01); *H01L 51/5253* (2013.01); *H01L 2251/5392* (2013.01)

(58) Field of Classification Search
CPC ... H01L 51/5221–5234; H01L 51/5215; H01L 51/5209
See application file for complete search history.

(56) References Cited

U.S. PATENT DOCUMENTS

| | | | |
|---|---|---|---|
| 9,054,341 | B2 | 6/2015 | Kim et al. |
| 9,091,913 | B2 | 7/2015 | Katz et al. |
| 10,008,556 | B2 | 6/2018 | Choung |
| 2003/0006699 | A1 | 1/2003 | Ogino et al. |
| 2012/0104422 | A1* | 5/2012 | Lee ........................ H01L 27/326 257/88 |
| 2012/0205678 | A1 | 8/2012 | Ikeda et al. |
| 2014/0145979 | A1* | 5/2014 | Lee ........................ G06F 3/0412 345/173 |
| 2014/0175390 | A1* | 6/2014 | Kim ........................ H01L 51/56 257/40 |
| 2015/0214284 | A1 | 7/2015 | Kim |
| 2016/0211483 | A1 | 7/2016 | Kwon |
| 2016/0248039 | A1 | 8/2016 | Choung et al. |
| 2017/0365812 | A1 | 12/2017 | Choung et al. |

FOREIGN PATENT DOCUMENTS

| | | |
|---|---|---|
| KR | 10-2014-0082089 | 7/2014 |
| KR | 10-2016-0103956 | 9/2016 |
| KR | 10-2017-0142231 | 12/2017 |
| KR | 10-2018-0001707 | 1/2018 |

* cited by examiner

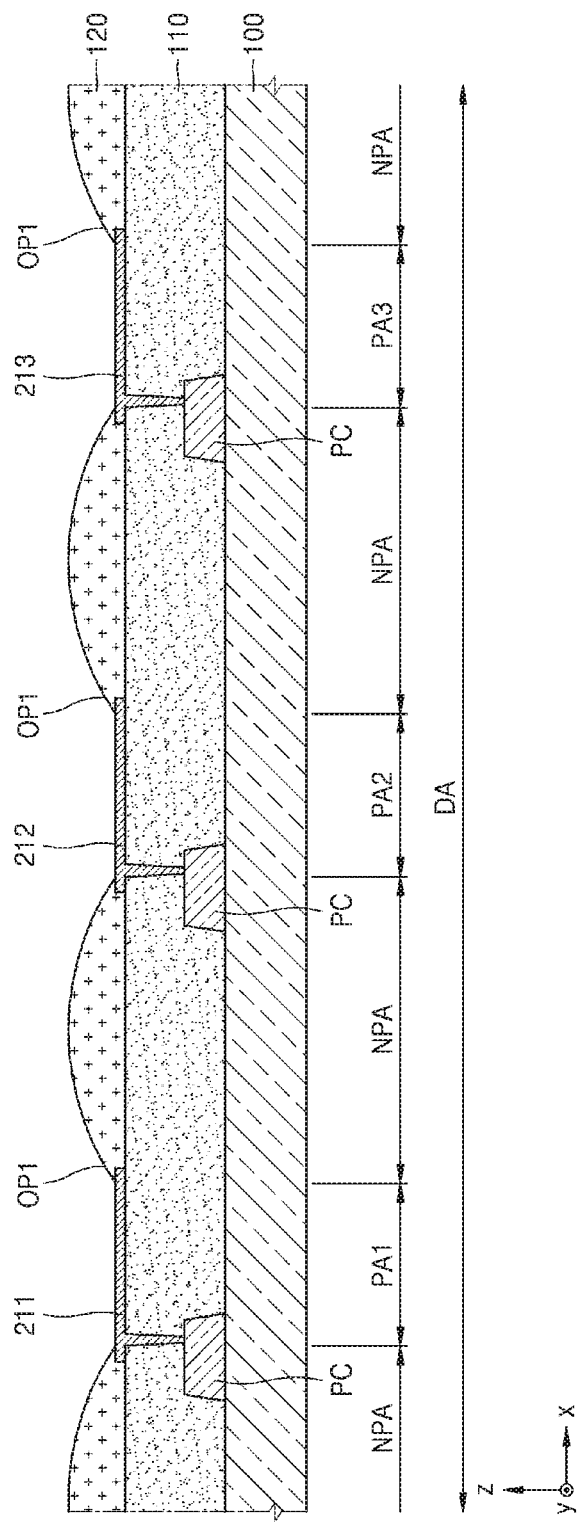

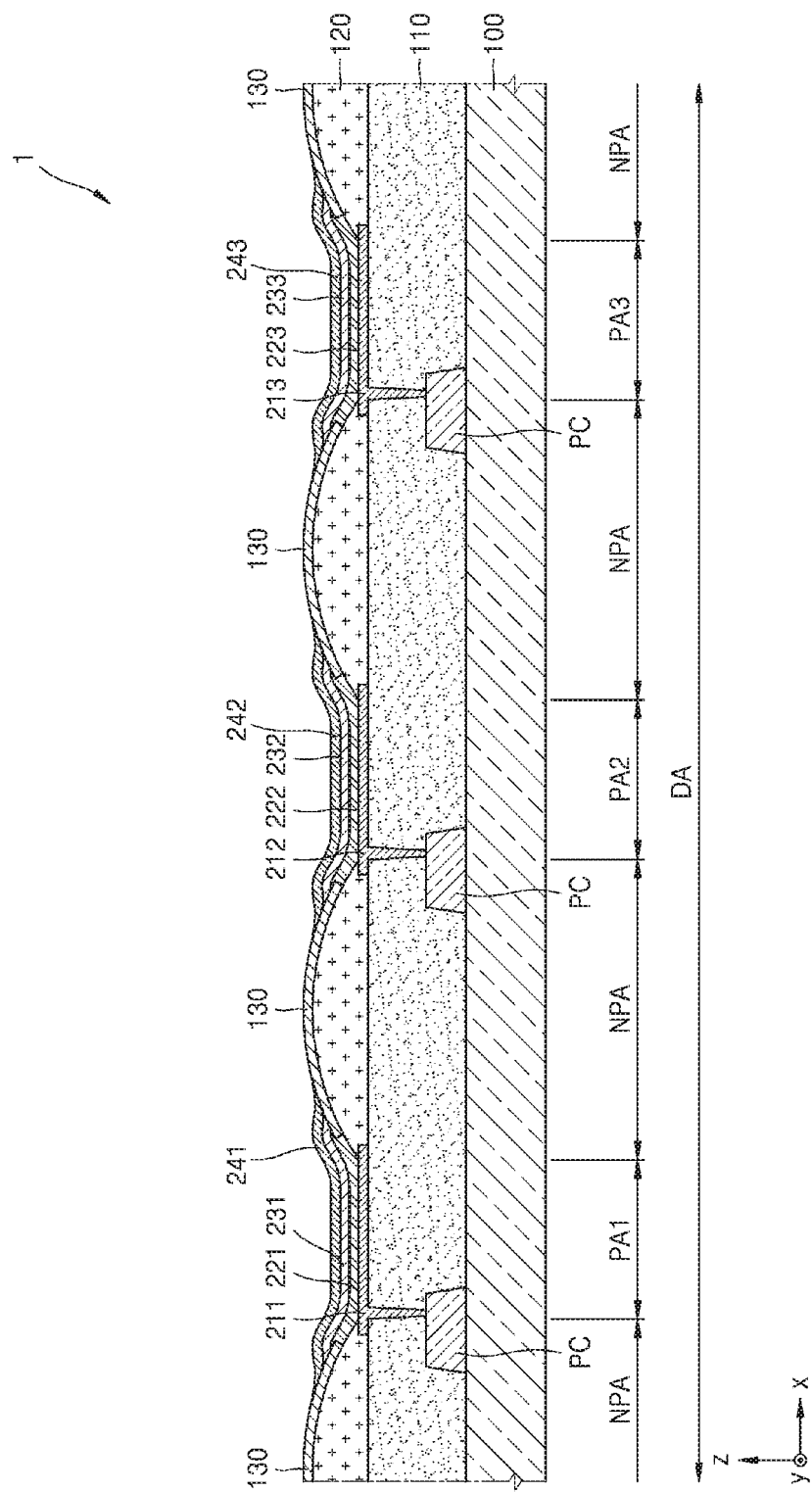

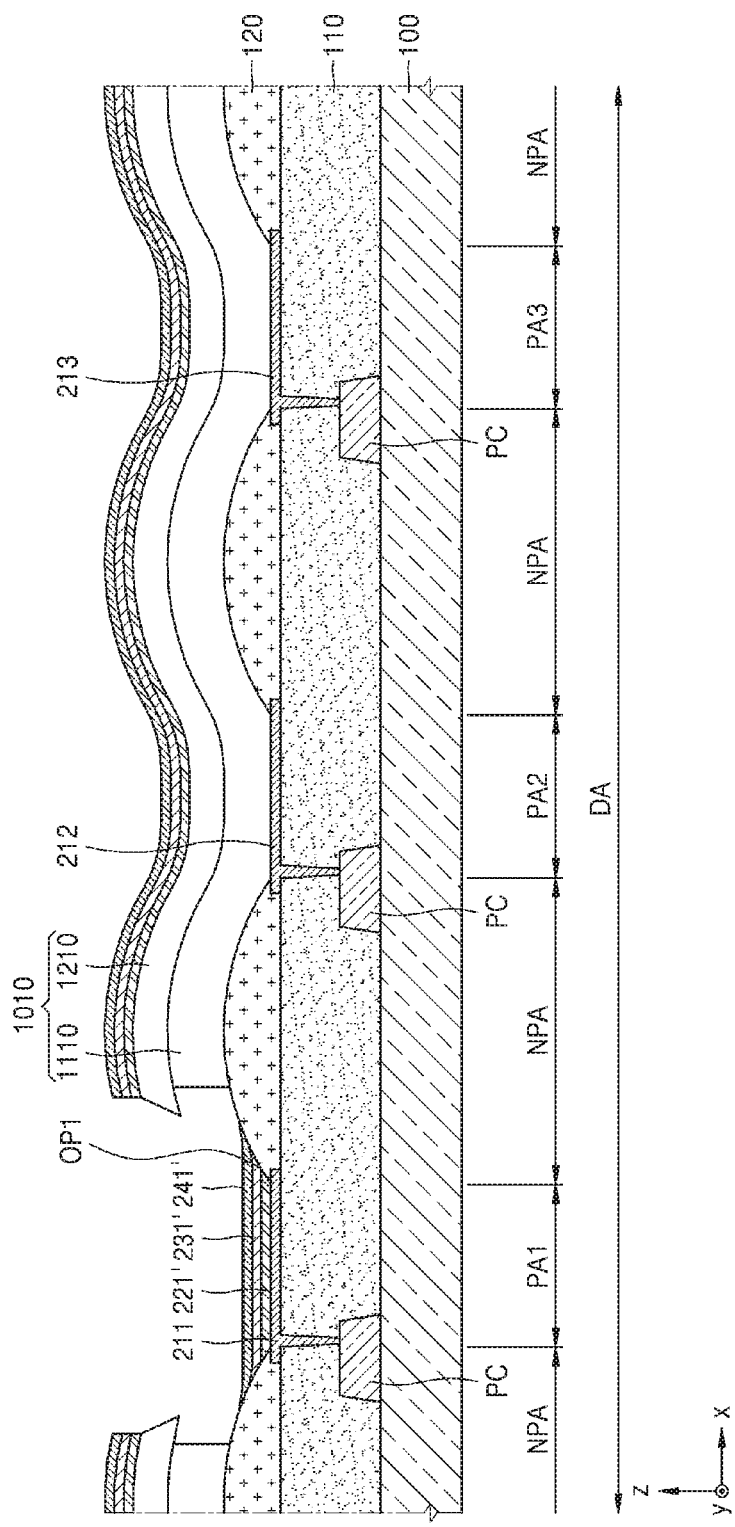

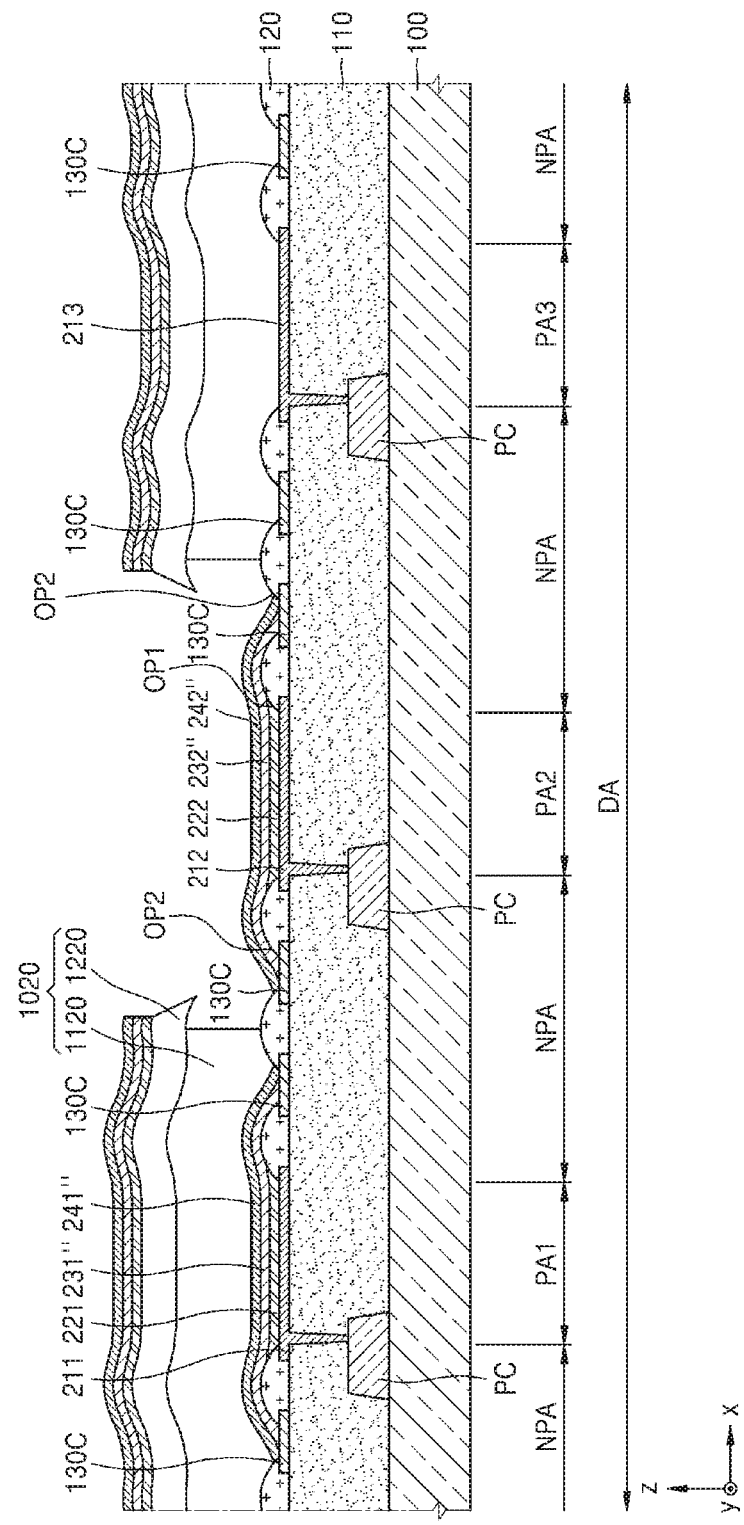

DISPLAY DEVICE

CROSS-REFERENCE TO RELATED APPLICATION

This application claims priority from and the benefit of Korean Patent Application No. 10-2016-0152241, filed Nov. 15, 2016, which is hereby incorporated by reference for all purposes as if fully set forth herein.

BACKGROUND

Field

Exemplary embodiments relate to a display device.

Discussion

An organic light-emitting display device is a display device including pixels each including an organic light-emitting diode. An organic light-emitting diode may include a pixel electrode, an opposite electrode facing the pixel electrode, and an emission layer between the pixel electrode and the opposite electrode. A "full color" organic light-emitting display device may include pixel areas that respectively emit different colors via corresponding emission layers, as well as include an opposite electrode provided as common body (or layer) over a plurality of pixels.

The above information disclosed in this section is only for enhancement of an understanding of the background of the inventive concepts, and, therefore, it may contain information that does not form prior art already known to a person of ordinary skill in the art.

SUMMARY

According to some exemplary embodiments, a display device includes a substrate, a first pixel electrode, a second pixel electrode, a pixel-defining layer, a first intermediate layer, a second intermediate layer, a first opposite electrode, a second opposite electrode, and a wiring layer. The substrate includes a first pixel area and a second pixel area. The first pixel area is spaced apart from the second pixel area by a non-pixel area. The first pixel electrode overlaps the first pixel area. The second pixel electrode overlaps the second pixel area. The pixel-defining layer includes a first opening overlapping the first pixel electrode and a second opening overlapping the second pixel electrode. The first intermediate layer is on the first pixel electrode. The first intermediate layer includes a first emission layer. The second intermediate layer is on the second pixel electrode. The second intermediate layer includes a second emission layer spaced apart from the first emission layer. The first opposite electrode is on the first intermediate layer. The second opposite electrode is on the second intermediate layer. The second opposite electrode is spaced apart from the first opposite electrode. The wiring layer overlaps the non-pixel area. The wiring layer contacts respective portions of the first opposite electrode and the second opposite electrode.

According to some exemplary embodiments, a display device includes a substrate, pixel electrodes, a pixel-defining layer, emission layers, opposite electrodes, and a wiring layer. The pixel electrodes are disposed on the substrate. The pixel-defining layer is disposed on the substrate. The pixel-defining layer includes a portion disposed between the pixel electrodes, and openings respectively overlapping the pixel electrodes. The emission layers are respectively disposed on the pixel electrodes. The opposite electrodes are respectively disposed on the emission layers. The opposite electrodes are spaced apart from one another. The wiring layer overlaps the portion of the pixel-defining layer. Respective portions of the opposite electrodes overlap corresponding portions of the wiring layer to form electrical connections.

According to some exemplary embodiments, a voltage drop may be reduced by providing opposite electrodes on a pixel-by-pixel basis and forming electrical connections between the opposite electrodes using a wiring layer. In this manner, occurrence of brightness deviation may be reduced. Also, some exemplary embodiments may prevent (or reduce) an underlying layer from being chopped by a deposition mask and a reduction in display quality.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 8A, 8B, 8C, 8D, 8E, 8F, 8G, and 8H are cross-sectional views of the display device of FIG. 3 at various stages of manufacture according to one or more exemplary embodiments.

FIGS. 13A, 13B, 13C, 13D, 13E, and 13F are cross-sectional views of the display device of FIG. 10 at various stages of manufacture according to one or more exemplary embodiments.

FIGS. 15A, 15B, 15C, 15D, and 15E are cross-sectional views of the display device of FIG. 14 at various stages of manufacture according to one or more exemplary embodiments.

DETAILED DESCRIPTION OF THE ILLUSTRATED EMBODIMENTS

Figure 1:
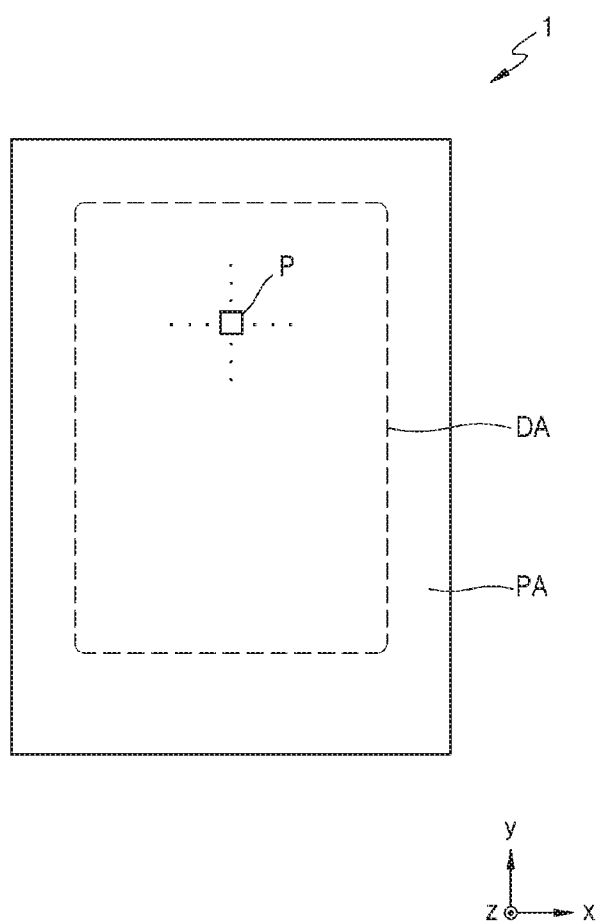
FIG. 1 is a plan view of a display device according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view of a display device according to one or more exemplary embodiments.

Referring to FIG. 1, the display device 1 includes a display (or active) area DA and a peripheral area PA, the peripheral area PA being a non-display (or non-active) area. Pixels P each including a display element (not shown), such as an organic light-emitting diode, are in the display area DA and display images. The peripheral area PA is an area not displaying images and may include a scan driver and a data driver providing electrical signals to be applied to the pixels P in the display area DA, and may also include power (or transmission) lines providing power, such as a driving voltage and a common voltage.

Figure 2A:
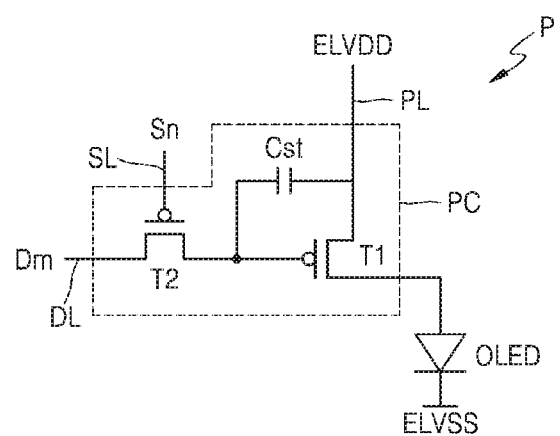
FIGS. 2A and 2B are equivalent circuit diagrams of a pixel according to various exemplary embodiments.
Figure 2B:
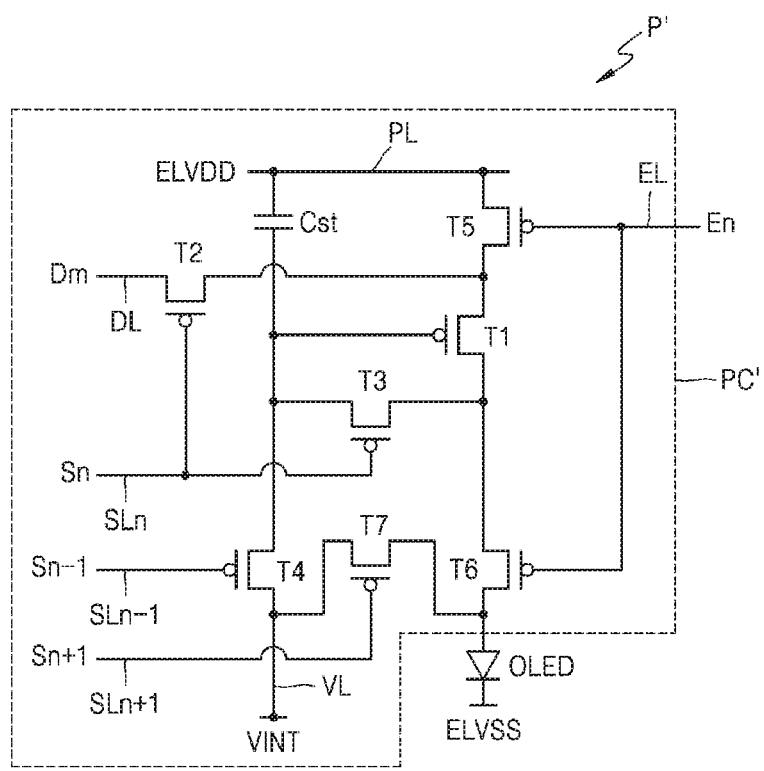

FIGS. 2A and 2B are equivalent circuit diagrams of a pixel according to various exemplary embodiments.

Referring to FIG. 2A, each pixel P includes a pixel circuit PC connected to a scan line SL and a data line DL, and an organic light-emitting diode OLED connected to the pixel circuit PC.

The pixel circuit PC includes a driving thin film transistor (TFT) T1, a switching TFT T2, and a storage capacitor Cst. The switching TFT T2 is connected to the scan line SL and the data line DL and transfers a data signal Dm input via the data line DL to the driving TFT T1 in response to a scan signal Sn input via the scan line SL.

The storage capacitor Cst is connected to the switching TFT T2 and a driving voltage line PL and stores a voltage corresponding to a difference between a voltage received through the switching TFT T2 and a driving voltage ELVDD supplied via the driving voltage line PL.

The driving TFT T1, which is connected to the driving voltage line PL and the storage capacitor Cst, may control a driving current flowing from the driving voltage line PL to the organic light-emitting diode OLED in response to the voltage stored in the storage capacitor Cst. An opposite electrode of the organic light-emitting diode OLED receives a common voltage ELVSS. The organic light-emitting diode OLED may emit light having brightness corresponding to the driving current.

Although FIG. 2A illustrates an exemplary embodiment with the pixel P including two TFTs and one storage capacitor, exemplary embodiments are not limited thereto or thereby.

Referring to FIG. 2B, the pixel circuit PC' may include the driving TFT T1 and the switching TFT T2, a compensation TFT T3, a first initialization TFT T4, a first emission control TFT T5, a second emission control TFT T6, and a second initialization TFT T7.

A drain electrode of the driving TFT T1 may be electrically connected to the organic light-emitting diode OLED via the second emission control TFT T6. The driving TFT T1 receives a data signal Dm and supplies the driving current to the organic light-emitting diode OLED in response to a switching operation of the switching TFT T2.

A gate electrode of the switching TFT T2 is connected to a first scan line SLn, and a source electrode of the switching TFT T2 is connected to a data line DL. A drain electrode of the switching TFT T2 may be connected to a source electrode of the driving TFT T1 and connected to a driving voltage line PL via the first emission control TFT T5.

The switching TFT T2 performs the switching operation in which the switching TFT T2 is turned on and transfers a data signal Dm transferred via the data line DL to the source electrode of the driving TFT T1 in response to a first scan signal Sn transferred via the first scan line SLn.

A gate electrode of the compensation TFT T3 may be connected to the first scan line SLn. A source electrode of the compensation TFT T3 may be connected to the drain electrode of the driving TFT T1 and connected to a pixel electrode of the organic light-emitting diode OLED via the second emission control TFT T6. A drain electrode of the compensation TFT T3 may be connected to a storage capacitor Cst, a source electrode of the first initialization TFT T4, and a gate electrode of the driving TFT T1. The compensation TFT T3 may be turned on in response to a first scan signal Sn transferred via the first scan line SLn such that the gate electrode of the driving TFT T1 and the drain electrode of the driving TFT T1 are connected to each other to enable the driving TFT T1 to be diode-connected.

A gate electrode of the first initialization TFT T4 may be connected to a second scan line SLn−1. A drain electrode of the first initialization TFT T4 may be connected to an initialization voltage line VL. The source electrode of the first initialization TFT T4 may be connected to the storage capacitor Cst, the drain electrode of the compensation TFT T3, and the gate electrode of the driving TFT T1. The first initialization TFT T4 may be turned on in response to a second scan signal Sn−1 transferred via the second scan line SLn−1 and may perform an operation of initializing a voltage of the gate electrode of the driving TFT T1 by transferring an initialization voltage VINT to the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the organic light-emitting diode OLED. When the first emission control TFT T5 and the second emission control TFT T6 are simultaneously turned on in response to an emission control signal En transferred via the emission control line EL, a driving voltage ELVDD may be transferred to the organic light-emitting diode OLED, and the driving current may flow through the organic light-emitting diode OLED.

A gate electrode of the second initialization TFT T7 may be connected to a third scan line SLn+1. A source electrode of the second initialization TFT T7 may be connected to the pixel electrode of the organic light-emitting diode OLED. A drain electrode of the second initialization TFT T7 may be connected to the initialization voltage line VL. The second initialization TFT T7 may be turned on and initialize the pixel electrode of the organic light-emitting diode in response to a third scan signal Sn+1 transferred via the third scan line SLn+1.

One of the electrodes of the storage capacitor Cst may be connected to the gate electrode of the driving TFT T1, the drain electrode of the compensation TFT T3, and the source electrode of the first initialization TFT T4. Another electrode of the storage capacitor Cst may be connected to the driving voltage line PL.

An opposite electrode of the organic light-emitting diode OLED receives a common voltage ELVSS. The organic light-emitting diode OLED may emit light when the driving current flows between the pixel electrode and the opposite electrode of the organic light-emitting diode OLED.

The pixel circuits PC and PC' are not limited to or by the circuit designs and the number of TFTs and storage capacitors described with reference to FIGS. 2A and 2B. The circuit design and the number of TFTs and storage capacitors may be variously changed.

Figure 3:
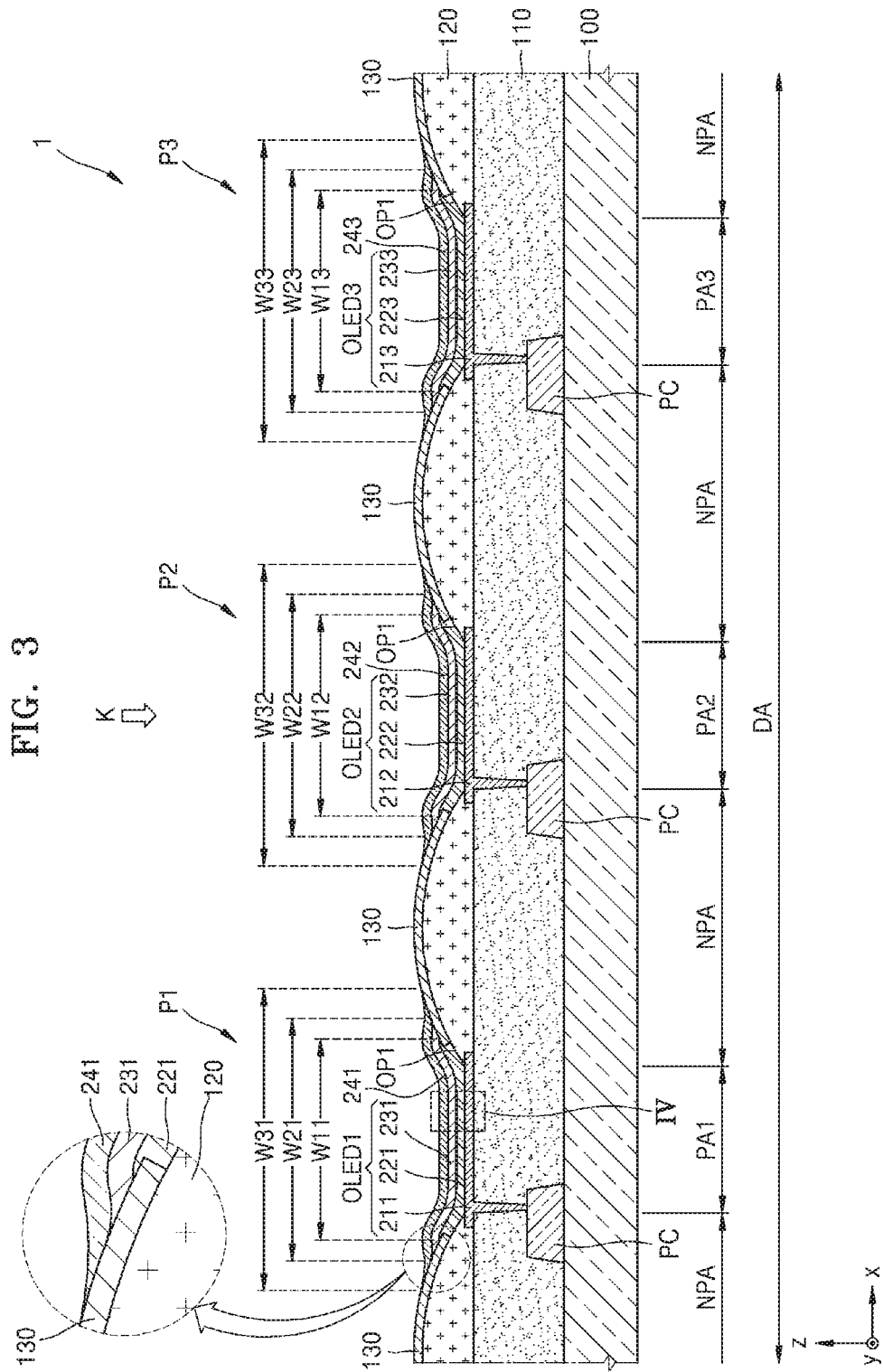
FIG. 3 is a cross-sectional view of a display device according to one or more exemplary embodiments.
Figure 4:
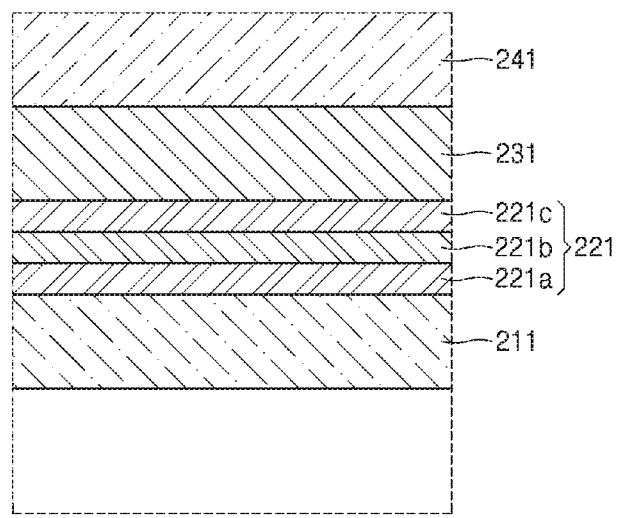
FIG. 4 is an enlarged cross-sectional view of portion IV of the display device of FIG. 3 according to one or more exemplary embodiments.

FIG. 3 is a cross-sectional view of a display device according to one or more exemplary embodiments. FIG. 4 is an enlarged cross-sectional view of portion IV of the display device of FIG. 3 according to one or more exemplary embodiments.

Referring to FIG. 3, a display area DA includes first to third pixel areas PA1, PA2, and PA3, and non-pixel areas NPA between adjacent pixel areas. Pixels, for example, first to third pixels P1, P2, and P3 are disposed respectively in the first to third pixel areas PA1, PA2, and PA3. In the present specification, the pixel area corresponds to an area which emits light, that is, an emission area.

The first to third pixels P1, P2, and P3 may respectively emit different colors. For example, the first pixel P1 may emit red, the second pixel P2 may emit green, and the third pixel P3 may emit blue. In one or more exemplary embodiments, the display area DA may further include a fourth pixel (not shown) that may emit white. It is contemplated, however, that any suitable color and groups of colors may be utilized in association with exemplary embodiments.

A substrate 100 may include various materials, such as a glass material or a plastic material, e.g., polyethylene terephthalate (PET), polyethylene napthalate (PEN), and polyimide (PI). When the substrate 100 includes a plastic material, the substrate 100 may have greater flexibility than when the substrate 100 includes a glass material.

A circuit element layer 110 including a pixel circuit PC is disposed on the substrate 100. In one or more exemplary embodiments, the pixel circuit PC may include the TFTs and the storage capacitor described with reference to at least one of FIGS. 2A and 2B. Layers forming the TFTs and the storage capacitor, for example, a semiconductor layer and electrode layers may be disposed with an insulating layer therebetween. The pixel circuits PC are respectively arranged to correspond to the first to third pixels P1, P2, and P3.

The pixel-defining layer 120 is disposed on the circuit element layer 110. The pixel-defining layer 120 may include openings OP1 overlapping the first to third pixel areas PA1, PA2, and PA3.

The first to third pixels P1, P2, and P3 respectively include first to third organic light-emitting diodes OLED1 to OLED3 electrically connected to the pixel circuits PC. Each of the first to third organic light-emitting diodes OLED1 to OLED3 includes a pixel electrode, an intermediate layer including an emission layer, and an opposite electrode.

The first organic light-emitting diode OLED1 includes a first pixel electrode 211, a first intermediate layer 221, and a first opposite electrode 231. The second organic light-emitting diode OLED2 includes a second pixel electrode 212, a second intermediate layer 222, and a second opposite electrode 232. The third organic light-emitting diode OLED3 includes a third pixel electrode 213, a third intermediate layer 223, and a third opposite electrode 233.

Ends of the first to third pixel electrodes 211, 212, and 213 are covered by the pixel-defining layer 120, which may prevent an electric short circuit by increasing distances between the first to third opposite electrodes 231, 232, and 233 and the ends of the first to third pixel electrodes 211, 212, and 213. Upper surfaces of the first to third pixel electrodes 211, 212, and 213 are exposed via the openings OP1 in the pixel-defining layer 120 and may respectively overlap the first to third intermediate layers 221, 222, and 223.

The first to third pixel electrodes 211, 212, and 213 are island-type electrodes respectively corresponding to the first to third pixel areas PA1, PA2, and PA3. The first to third pixel electrodes 211, 212, and 213 are spaced apart from each other on the circuit element layer 110. The first to third pixel electrodes 211, 212, and 213 may be reflective electrodes or light-transmissive electrodes.

In the case where the first to third pixel electrodes 211, 212, and 213 are reflective electrodes, the first to third pixel electrodes 211, 212, and 213 may include a reflective layer including at least one of Ag, Mg, Al, Pt, Pd, Au, Ni, Nd, Ir, and Cr, or a compound thereof. It is also contemplated that each of the first to third pixel electrodes 211, 212, and 213 may include a reflective layer and a transparent conductive oxide (TCO) layer over and/or below the reflective layer. In one or more exemplary embodiments, each of the first to third pixel electrodes 211, 212, and 213 may have a triple layer structure including ITO/Ag/ITO.

In the case where the first to third pixel electrodes 211, 212, and 213 are light-transmissive electrodes, the first to third pixel electrodes 211, 212, and 213 may be TCO layers. As another example, each of the first to third pixel electrodes 211, 212, and 213 may be a thin metallic layer including Ag or an Ag alloy, or may be a multi-layer structure including the thin metallic layer and a TCO layer over the thin metallic layer.

The first to third intermediate layers 221, 222, and 223 are island-type layers respectively corresponding to the first to third pixel areas PA1, PA2, and PA3. The first to third intermediate layers 221, 222, and 223 are spaced apart from each other. The first to third intermediate layers 221, 222, and 223 are disposed respectively on the first to third pixel electrodes 211, 212, and 213 via the openings OP1 of the pixel-defining layer 120.

Referring to FIGS. 3 and 4, the first intermediate layer 221 includes an emission layer 221b. The emission layer 221b may be an organic emission layer emitting, for example, red light. The first intermediate layer 221 may further include first and second functional layers 221a and 221c over and/or under the emission layer 221b. The first functional layer 221a may include a hole injection layer (HIL) and/or a hole transport layer (HTL). The second functional layer 221c may include an electron transport layer (ETL) and/or an electron injection layer (EIL).

Referring to FIG. 3 again, the second intermediate layer 222 includes an emission layer which is an organic emission layer emitting, for example, green light. The second intermediate layer 222 may further include functional layers over and/or under the emission layer, for example, an HIL, an HTL, an ETL, and/or an EIL. The third intermediate layer 223 includes an emission layer, which is an organic emission layer emitting, for instance, blue light. The third intermediate layer 223 may further include functional layers over and/or under the emission layer, for example, an HIL, an HTL, an ETL, and/or an EIL.

The first to third intermediate layers 221, 222, and 223 may have different thicknesses. Since the first to third intermediate layers 221, 222, and 223 are patterned individually and/or separately via a process described in more detail below, the functional layers of the first to third intermediate layers 221, 222, and 223 may have different materials and different thicknesses.

The first to third opposite electrodes 231, 232, and 233 are island-type electrodes respectively corresponding to the first to third pixel areas PA1, PA2, and PA3. The first to third opposite electrodes 231, 232, and 233 are spaced apart from each other. The first to third opposite electrodes 231, 232, and 233 are disposed respectively on the first to third intermediate layers 221, 222, and 223.

Widths W21, W22, and W23 of the first to third opposite electrodes 231, 232, and 233 may be greater than widths W11, W12, and W13 of the first to third intermediate layers 221, 222, and 223. Ends of the first to third opposite electrodes 231, 232, and 233 may extend farther toward a wiring layer 130 than ends of the first to third intermediate layers 221, 222, and 223. The ends of the first to third opposite electrodes 231, 232, and 233 may contact the wiring layer 130 to provide a common voltage to the first to third opposite electrodes 231, 232, and 233.

The first to third opposite electrodes 231, 232, and 233 may be light-transmissive electrodes or reflective electrodes. The first to third opposite electrodes 231, 232, and 233 may be thin metallic layers or thick metallic layers including at least one of Ag, Mg, Al, Yb, Ca, Li, and Au. For example, the first to third opposite electrodes 231, 232, and 233 may be single layer structures or multi-layer structures including at least one of Ag, Mg, Al, Yb, Ca, LiF/Ca, LiF/Al, Al, and Au. In one or more exemplary embodiments, the first to third opposite electrodes 231, 232, and 233 may include a thin metallic layer including Ag and Mg in which Ag content may be greater than Mg content.

In one or more exemplary embodiments, the first to third opposite electrodes 231, 232, and 233 may be light-transmissive electrodes having a thin thickness or may be reflective electrodes having a thick thickness. For example, metal including Ag and Mg and having a thickness ranging from about 10 Å to about 15 Å may be used as an electrode having a light transmission characteristic, or metal including Ag and Mg and having a thickness of about 50 nm or more may be used as a reflective electrode.

The first to third opposite electrodes 231, 232, and 233 may be respectively covered with first to third passivation layers 241, 242, and 243. The first to third passivation layers 241, 242, and 243 may prevent the first to third opposite electrodes 231, 232, and 233 (and layers therebelow) from being damaged during a manufacturing process. Widths W31, W32, and W33 of the first to third passivation layers 241, 242, and 243 are greater than the widths W21, W22, and W23 of the first to third opposite electrodes 231, 232, and 233. For example, ends of the first to third passivation layers 241, 242, and 243 extend farther toward the wiring layer 130 than ends of the first to third opposite electrodes 231, 232, and 233. In this manner, ends of the first to third passivation layers 241, 242, and 243 may contact the wiring layer 130. The first to third passivation layers 241, 242, and 243 may include an inorganic insulating material, such as SiOx, SiNx and/or SiON, and may be single layers or multi-layers.

The island-type first to third opposite electrodes 231, 232, and 233 that are spaced apart from each other may be electrically connected to each other via the wiring layer 130. In this manner, the first to third opposite electrodes 231, 232, and 233 may be connected to a common power line and receive the common voltage ELVSS.

The wiring layer 130 corresponds to the non-pixel areas NPA. The wiring layer 130 is disposed on the pixel-defining layer 120. The wiring layer 130 may directly contact the pixel-defining layer 120. The wiring layer 130 may include a conductive material, for example, a metal or a TCO, and may be a single layer or a multi-layer.

Referring to an enlarged portion of FIG. 3, the first opposite electrode 231 may extend to non-pixel areas NPA neighboring the first pixel area PA1 to contact an upper surface of the wiring layer 130. A portion of the first opposite electrode 231 (e.g., an end of the first opposite electrode 231) may overlap the wiring layer 130. Likewise, each of the second and third opposite electrodes 232 and 233 may extend to non-pixel areas NPA neighboring a corresponding pixel area to contact an upper surface of the wiring layer 130. A portion of each of the second and third opposite electrodes 232 and 233 (e.g., an end of each of the second and third opposite electrodes 232 and 233) may overlap the wiring layer 130. In this manner, the wiring layer 130 may directly contact the first to third opposite electrodes 231, 232, and 233.

Figure 5:
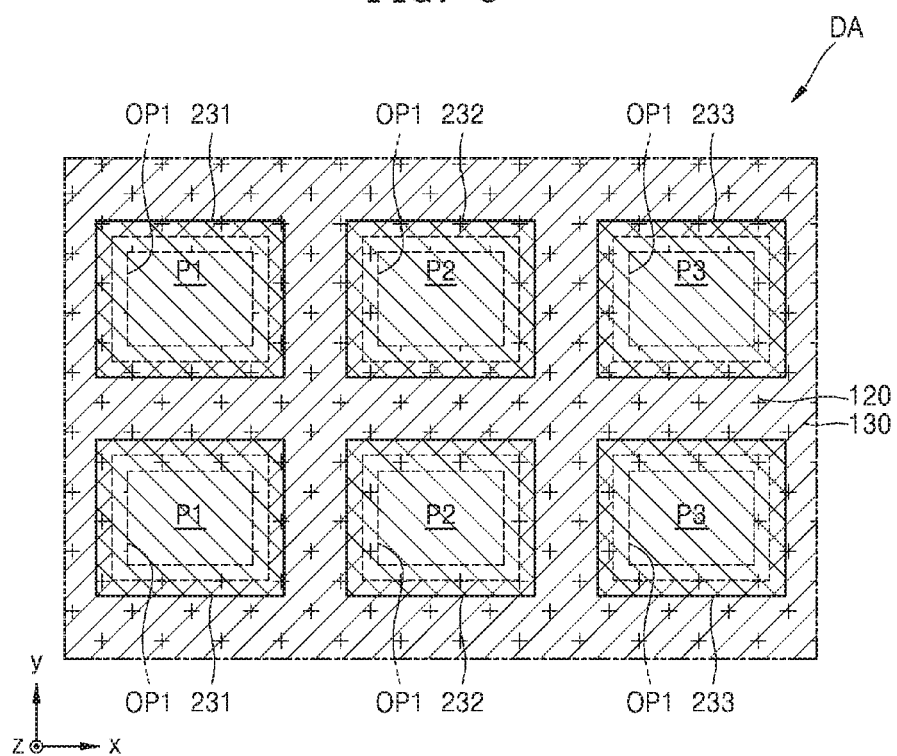
FIG. 5 is a plan view of the display device of FIG. 3 viewed in a direction K according to one or more exemplary embodiments.
Figure 6:
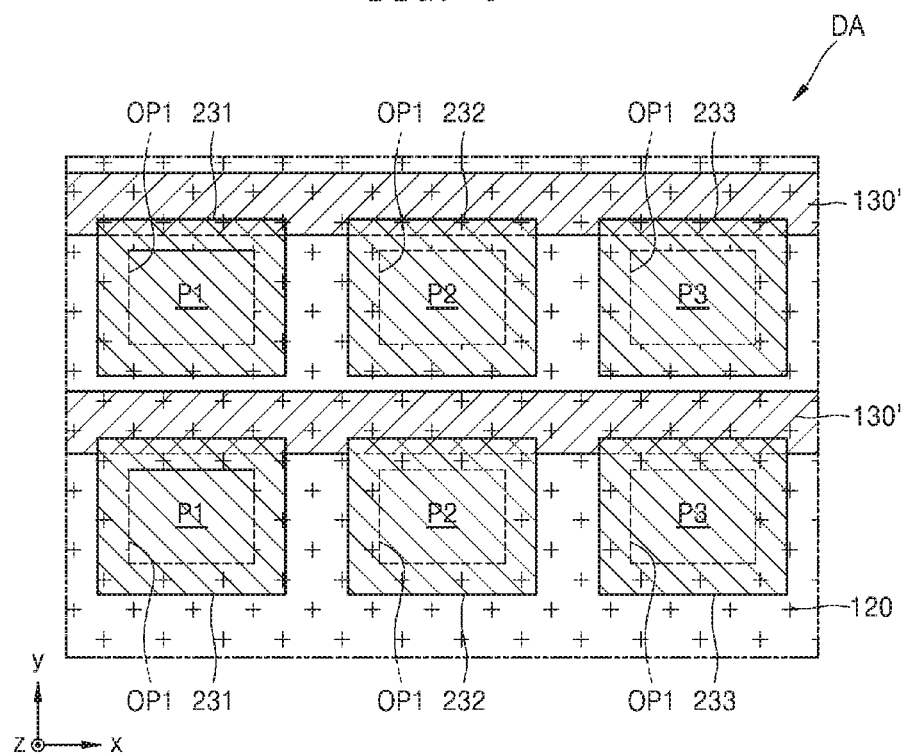
FIG. 6 is a plan view of the display device of FIG. 3 viewed in the direction K according to one or more exemplary embodiments.

FIG. 5 is a plan view of the display device of FIG. 3 viewed in a direction K according to one or more exemplary embodiments. FIG. 6 is a plan view of the display device of FIG. 3 viewed in the direction K according to one or more exemplary embodiments. For illustrative and descriptive convenience, FIGS. 5 and 6 only illustrate the pixel-defining layer 120, the wiring layer 130, and the first to third opposite electrodes 231, 232, and 233 of the display device of FIG. 3.

Referring to FIG. 5, in one or more exemplary embodiments, the wiring layer 130 may have a mesh form in the non-pixel areas NPA. The wiring layer 130 may be disposed on the pixel-defining layers 120 in the non-pixel areas NPA and directly contact the first to third opposite electrodes 231, 232, and 233. The wiring layer 130 may overlap portions of the first to third opposite electrodes 231, 232, and 233.

Referring to FIG. 6, in one or more exemplary embodiments, a plurality of wiring layers 130' are disposed in the non-pixel areas NPA. Each of the wiring layers 130' may have a striped form in the non-pixel areas NPA. The wiring layers 130' having the striped form may be disposed on the pixel-defining layers 120 in the non-pixel areas NPA. The wiring layers 130' may directly contact the first to third opposite electrodes 231, 232, and 233, and overlap portions of the first to third opposite electrodes 231, 232, and 233.

With reference to FIGS. 5 and 6, the wiring layers 130 and 130' may be patterned in various forms. Shapes of the wiring layers 130 and 130' are not limited to the mesh form or the striped form illustrated in FIGS. 5 and 6. It is also noted that the wiring layers 130 or 130' may be connected to the first to third opposite electrodes 231, 232, and 233 such that the first to third opposite electrodes 231, 232, and 233 are electrically connected (or coupled) to each other by the wiring layers 130 or 130'. For instance, first to third opposite electrodes 231, 232, and 233 that are adjacent to one another in the X-direction may be electrically connected to one another via a common wiring layer of the wiring layers 130'.

Figure 7A:
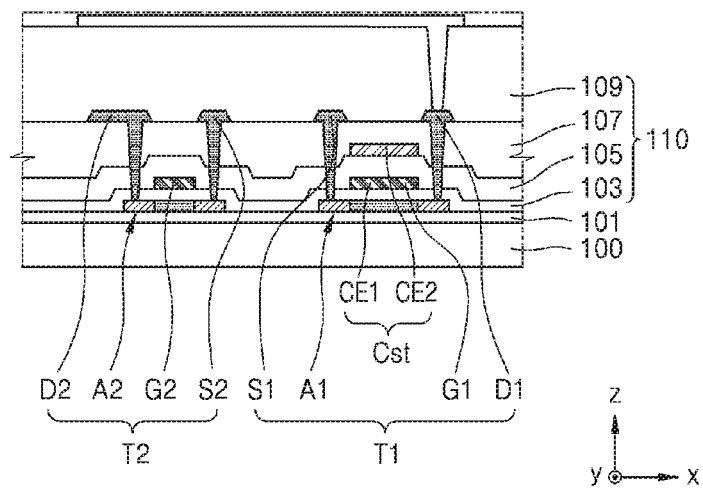
FIGS. 7A and 7B are cross-sectional views of circuit element layers of display devices according to various exemplary embodiments.
Figure 7B:
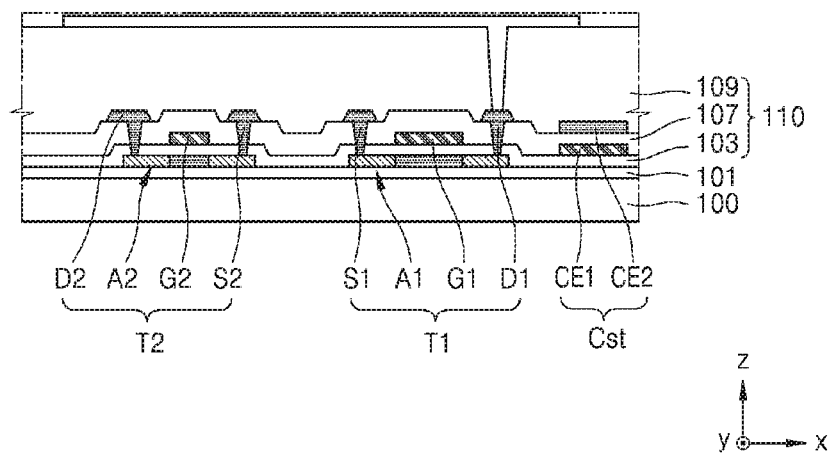

FIGS. 7A and 7B are cross-sectional views of circuit element layers of display devices according to various exemplary embodiments.

Referring to FIG. 7A, the driving TFT T1 may include a driving semiconductor layer A1, a driving gate electrode G1, a driving source electrode S1, and a driving drain electrode D1. The switching TFT T2 may include a switching semiconductor layer A2, a switching gate electrode G2, a switching source electrode S2, and a switching drain electrode D2. The storage capacitor Cst may include a first storage capacitor plate CE1 and a second storage capacitor plate CE2.

A gate insulating layer 103 is disposed between the driving and switching semiconductor layers A1 and A2 and the driving and switching gate electrodes G1 and G2. A dielectric layer 105 is disposed between the first and second storage capacitor plates CE1 and CE2. An interlayer insulating layer 107 is disposed between the driving and switching gate electrodes G1 and G2 and the driving and switching source/drain electrodes S1, D1, S2, and D2. A planarization insulating layer 109 is disposed on the driving and switching source/drain electrodes S1, D1, S2, and D2.

The gate insulating layer 103 may be a single layer or a multi-layer including an inorganic material, such as SiNx and/or SiOx. The dielectric layer 105 and the interlayer insulating layer 107 may be single layers or multi-layers including an inorganic material, such as SiOx, SiNx, and/or $Al_2O_3$. The planarization layer 109 may include an organic material including a general-purpose polymer, such as polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. However, exemplary embodiments are not limited thereto or thereby.

Although FIG. 7A illustrates the storage capacitor Cst overlapping the driving TFT T1, and the driving gate electrode G1 also serving as the first storage capacitor plate CE1, exemplary embodiments are not limited thereto or thereby.

Referring to FIG. 7B, the storage capacitor Cst does not overlap the driving TFT T1. For example, the first storage capacitor plate CE1 and the driving gate electrode G1 include the same material. The second storage capacitor plate CE2 includes the same material as that of the driving source and drain electrodes S1 and D1. The interlayer insulating layer 107 may be disposed between the first and second storage capacitor plates CE1 and CE2.

Although exemplary embodiments described with reference to FIGS. 7A and 7B include the driving and switching gate electrodes G1 and G2 of the driving and switching TFTs T1 and T2 being disposed respectively over the driving and switching semiconductor layers A1 and A2, exemplary embodiments are not limited thereto or thereby. For instance, the driving and switching gate electrodes G1 and G2 may be disposed respectively below the driving and switching semiconductor layers A1 and A2. Depending on the locations of the driving and switching gate electrodes G1 and G2, the driving and switching semiconductor layers A1 and A2 may be disposed directly on a buffer layer 101 in one or more exemplary embodiments, or the driving and switching gate electrodes G1 and G2 may be disposed directly on the buffer layer 101 in other exemplary embodiments. It is also contemplated that dual gate structures may be utilized in association with one or more exemplary embodiments.

FIGS. 8A to 8H are cross-sectional views of the display device of FIG. 3 at various stages of manufacture according to one or more exemplary embodiments.

Referring to FIG. 8A, the circuit element layer 110 including the pixel circuit PC is formed on the substrate 100. The first to third pixel electrodes 211, 212, and 213 are formed on the circuit element layer 110. The first to third pixel electrodes 211, 212, and 213 respectively correspond to the first to third pixel areas PA1, PA2, and PA3. For example, the first to third pixel electrodes 211, 212, and 213 may be formed by forming a preliminary pixel electrode layer (not shown) on the circuit element layer 110 and then patterning the preliminary pixel electrode layer. Since the material of the substrate 100 and the materials of the first to third pixel electrodes 211, 212, and 213 have been described above with reference to FIG. 3, duplicative descriptions are omitted.

The pixel-defining layer 120 having the openings OP1 respectively exposing the first to third pixel electrodes 211, 212, and 213 is formed by forming an insulating layer (not shown) on the first to third pixel electrodes 211, 212, and 213 and then patterning the insulating layer. The insulating layer of the pixel-defining layer 120 may be an organic material. In one or more exemplary embodiments, the insulating layer of the pixel-defining layer 120 may be an inorganic material or may include an organic material and an inorganic material.

Figure 8B:
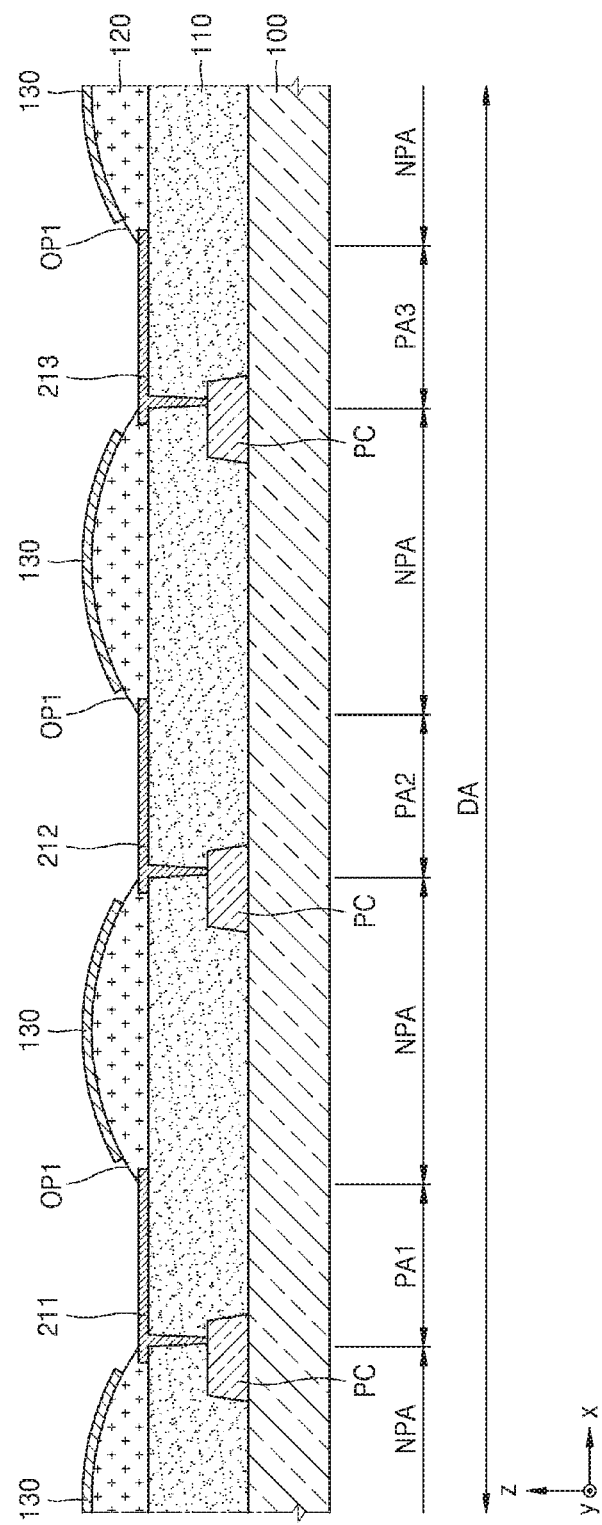

Referring to FIG. 8B, the wiring layer 130 is formed in the non-pixel areas NPA. The wiring layer 130 may include a conductive material, for example, metal or a TCO and may be a single layer or a multi-layer.

The wiring layer 130 may be formed using various methods. In one or more exemplary embodiments, the wiring layer 130 may be formed on the pixel-defining layer 120 in the non-pixel areas NPA by forming a conductive material layer (not shown) and then performing photolithography and wet or dry etching the conductive material layer. For the etching, dry etching may be used for fine patterning. In this case, to prevent the first to third pixel electrodes 211, 212, and 213 from being damaged, the conductive material of the wiring layer 130 may include a material having etch selectivity different from that of the materials of the first to third pixel electrodes 211, 212, and 213.

In one or more exemplary embodiments, the wiring layer 130 may be formed by forming a masking layer (not shown) including a positive or negative resist material on a portion corresponding to the wiring layer 130 and then depositing a conductive material by methods, such as thermal evaporation, etc. Since the first to third pixel electrodes 211, 212, and 213 are covered by the masking layer, unlike the above-described dry etching, the first to third pixel electrodes 211, 212, and 213 may be not damaged during a process of forming the wiring layer 130. In this case, the conductive material of the wiring layer 130 may include the same material as that of the first to third pixel electrodes 211, 212, and 213.

Figure 8C:
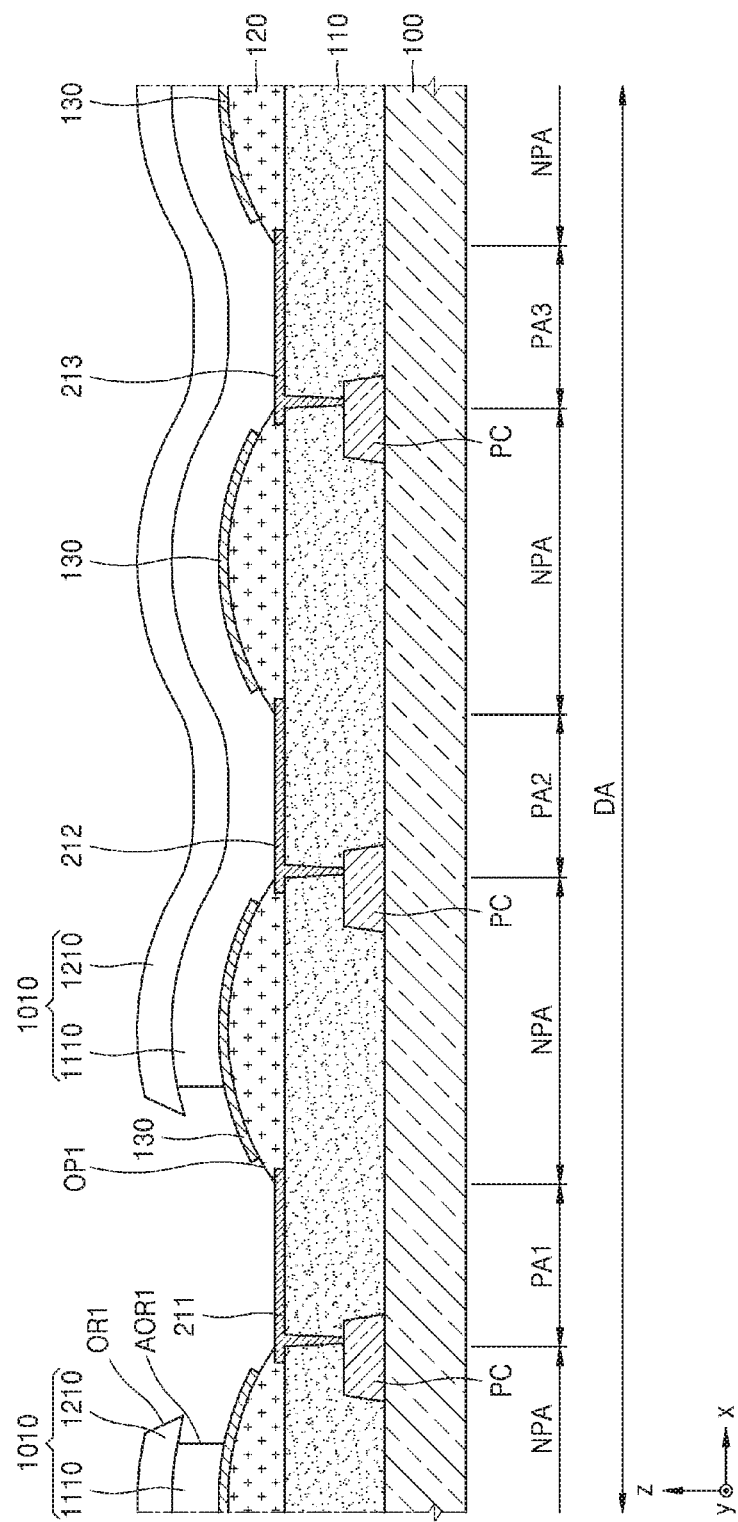

Referring to FIG. 8C, a first masking layer 1010 including an open portion corresponding to the first pixel area PA1 is formed. The first masking layer 1010 may include a first photosensitive pattern layer 1210 and a first auxiliary layer 1110, the first auxiliary layer 1110 being between the first photosensitive pattern layer 1210 and the pixel-defining layer 120.

In one or more exemplary embodiments, the first masking layer 1010 may be formed by a process described below.

A non-photosensitive organic material layer (not shown) may be formed over the substrate 100 over which the wiring layer 130 has been formed, and a photoresist layer (not shown) may be formed thereon. The non-photosensitive organic material layer may include, for example, a fluorine-based material, but exemplary embodiments are not limited thereto or thereby. The photoresist layer may include a positive photosensitive material.

The first photosensitive pattern layer 1210 having a first opening region OR1 may be formed by exposing and developing a portion of the photoresist layer corresponding to the first pixel area PA1. A first auxiliary opening region AOR1 may be formed by etching the non-photosensitive organic material layer exposed via the first opening region OR1. By the etching, the first auxiliary opening region AOR1 of the first auxiliary layer 1110 may be formed larger (e.g., wider) than the first opening region OR1.

The first auxiliary layer 1110 is disposed on the wiring layer 130, does not cover an end of the wiring layer 130, and, as such, exposes the end (e.g., an end adjacent to the first pixel electrode 211) of the wiring layer 130.

Figure 8D:
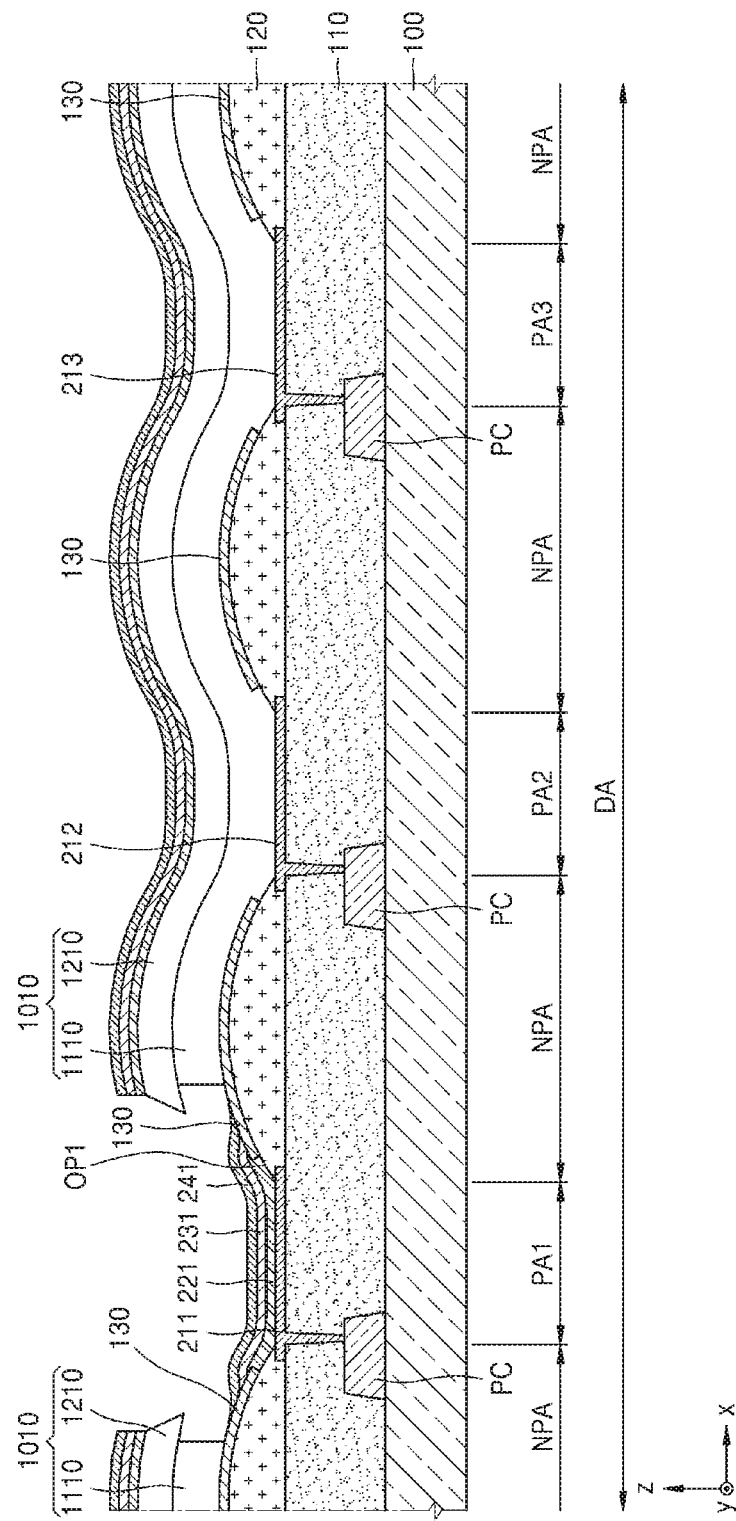

Referring to FIG. 8D, the first intermediate layer 221, the first opposite electrode 231, and the first passivation layer 241 are sequentially formed over the substrate 100 over which the first masking layer 1010 has been formed. Since the materials of the first intermediate layer 221, the first opposite electrode 231, and the first passivation layer 241 have been described above with reference to FIG. 3, duplicative descriptions are omitted and processes thereof are mainly described below.

The first intermediate layer 221 and the first opposite electrode 231 may be formed by thermal evaporation. Deposition materials for forming the first intermediate layer 221 and the first opposite electrode 231 may move toward the substrate 100 in a direction perpendicular to the substrate 100 and in an oblique direction with respect to the substrate 100. In this manner, an end of the first intermediate layer 221 and an end of the first opposite electrode 231 may extend to a space below the first photosensitive pattern layer 1210 without contacting the first auxiliary layer 1110. While the deposition materials are deposited in the oblique direction, the ends of the first intermediate layer 221 and the first opposite electrode 231 may have forward tapered shapes. The end of the first opposite electrode 231 may extend farther than the end of the first intermediate layer 221 such that the first opposite electrode 231 has a greater width than a width of the first intermediate layer 221, and may contact the wiring layer 130. The first opposite electrode 231 may directly contact an upper surface of the wiring layer 130 and may be electrically and directly connected thereto.

In one or more exemplary embodiments, the first passivation layer 241 may be formed by chemical vapor deposition (CVD). A deposition material for forming the first passivation layer 241 may move toward the substrate 100 in the direction perpendicular to the substrate 100 and in the oblique direction with respect to the substrate 100. In this manner, the end of the first passivation layer 241 may extend to the space below the first photosensitive pattern layer 1210 without contacting the first auxiliary layer 1110. The end of the first passivation layer 241 may have a forward tapered shape. To prevent the first opposite electrode 231 (and layers disposed therebelow) from being damaged during a later process, the first passivation layer 241 may have a greater width than a width of the first opposite electrode 231.

Figure 8E:
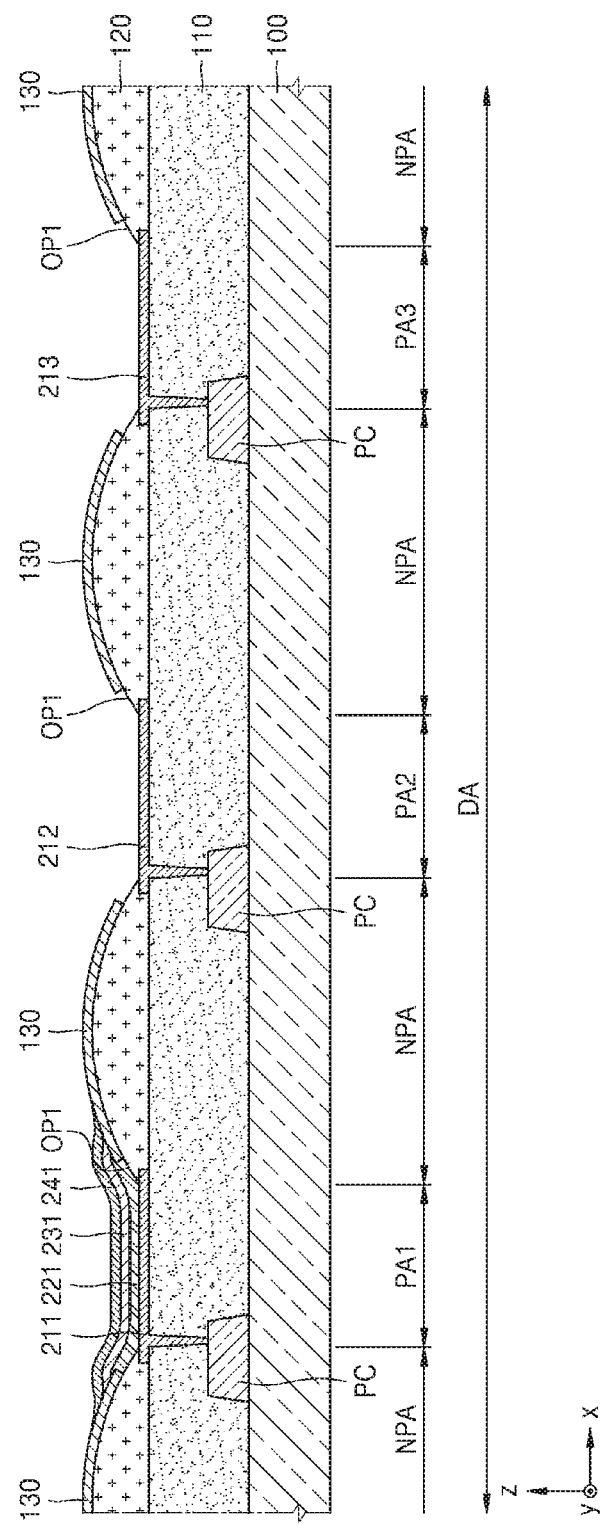

Referring to FIG. 8E, the first masking layer 1010 is removed via a lift-off process. In one or more exemplary embodiments, in the case where the first auxiliary layer 1110 is a fluorine-based material, the first auxiliary layer 1110 may be removed using a fluorine-based solvent. While the first auxiliary layer 1110 is removed, the first photosensitive pattern layer 1210 on the first auxiliary layer 1110, and the first intermediate layer 221, the first opposite electrode 231, and the first passivation layer 241 stacked on the first photosensitive pattern layer 1210, are removed simultaneously. Also, the first intermediate layer 221, the first opposite electrode 231, and the first passivation layer 241 remain in the first pixel area PA1 in island-type forms.

The first passivation layer 241 may protect the first organic light-emitting diode OLED1 during the lift-off process. That is, the first passivation layer 241 may prevent a material for removing the first masking layer 1010, such as the fluorine-based solvent, from penetrating into the first organic light-emitting diode OLED1 and damaging the same during the lift-off process.

Figure 8F:
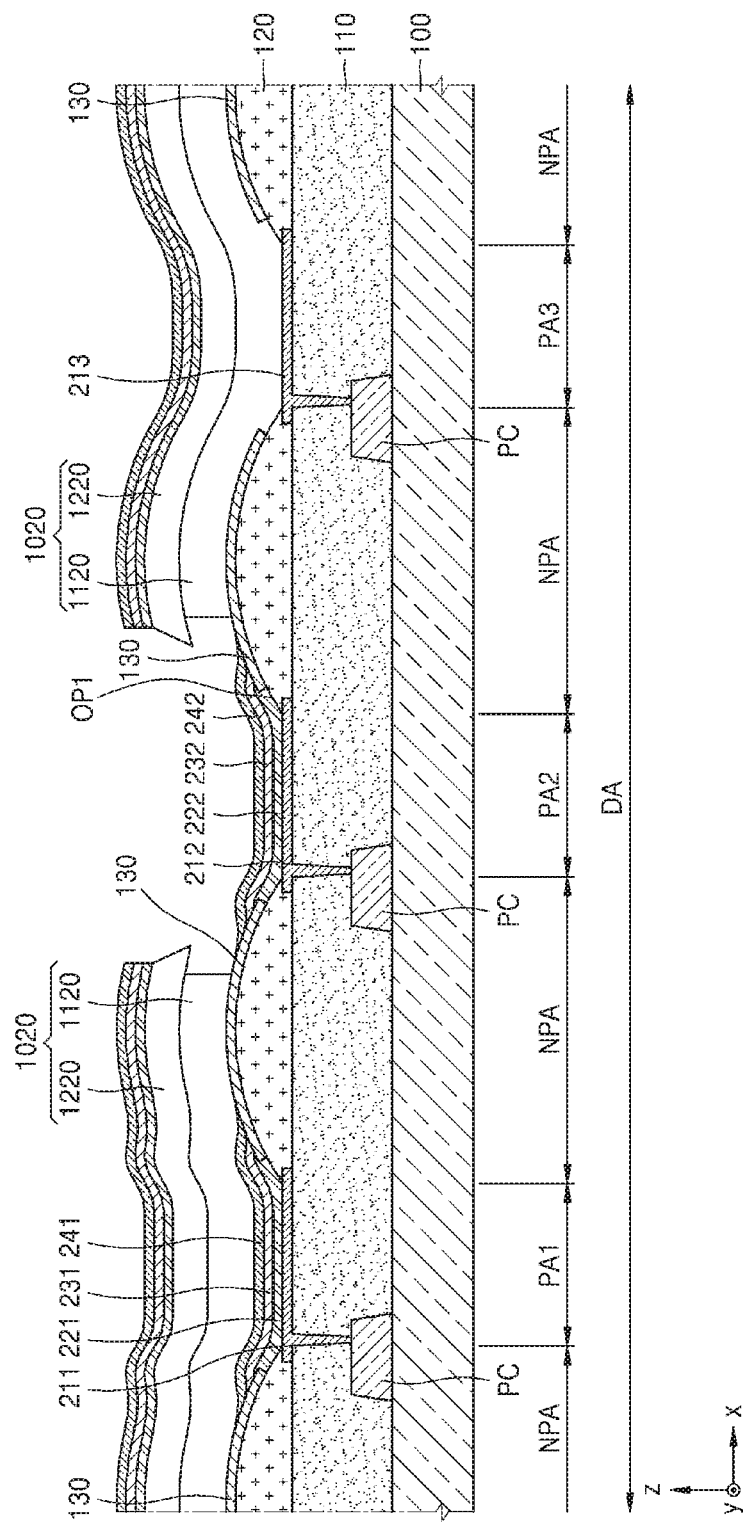

Referring to FIG. 8F, a second masking layer 1020 including an open portion corresponding to the second pixel area PA2 is formed. The second masking layer 1020 may include a second photosensitive pattern layer 1220 and a second auxiliary layer 1120 between the second photosensitive pattern layer 1220 and the pixel-defining layer 120. The second auxiliary layer 1120 and the second photosensitive pattern layer 1220 may respectively include the same materials as those of the first auxiliary layer 1110 and the first photosensitive pattern layer 1210, and may be formed by the same processes described above.

The second intermediate layer 222, the second opposite electrode 232, and the second passivation layer 242 may be sequentially formed over the substrate 100 over which the second masking layer 1020 has been formed. Since the materials of the second intermediate layer 222, the second opposite electrode 232, and the second passivation layer 242 have been described above with reference to FIG. 3, duplicative descriptions are omitted. The second intermediate layer 222 and the second opposite electrode 232 may be formed by thermal evaporation, and the second passivation layer 242 may be formed by CVD.

Deposition materials for forming the second intermediate layer 222, the second opposite electrode 232, and the second passivation layer 242 may move toward the substrate 100 in the direction perpendicular to the substrate 100 and in the oblique direction with respect to the substrate 100. In this manner, ends of the second intermediate layer 222, the second opposite electrode 232, and the second passivation layer 242 may have forward tapered shapes without contacting the second auxiliary layer 1120.

An end of the second opposite electrode 232 may extend farther than an end of the second intermediate layer 222 such that the second opposite electrode 232 has a greater width than a width of the second intermediate layer 222, and may contact the wiring layer 130. The second opposite electrode 232 may directly contact an upper surface of the wiring layer 130 and be directly and electrically connected to the wiring layer 130. The second passivation layer 242 has a greater width than a width of the second opposite electrode 232, and, as such, may prevent the second opposite electrode 232 (and layers disposed therebelow) from being damaged.

The second masking layer 1020 may be removed via a lift-off process. For example, the second photosensitive pattern layer 1220, the second intermediate layer 222, the second opposite electrode 232, and the second passivation layer 242 on the second auxiliary layer 1120 may be simultaneously removed by removing the second auxiliary layer 1120 using a fluorine-based solvent. Also, the second intermediate layer 222, the second opposite electrode 232, and the second passivation layer 242 remain in the second pixel area PA2 in island-type forms.

Figure 8G:
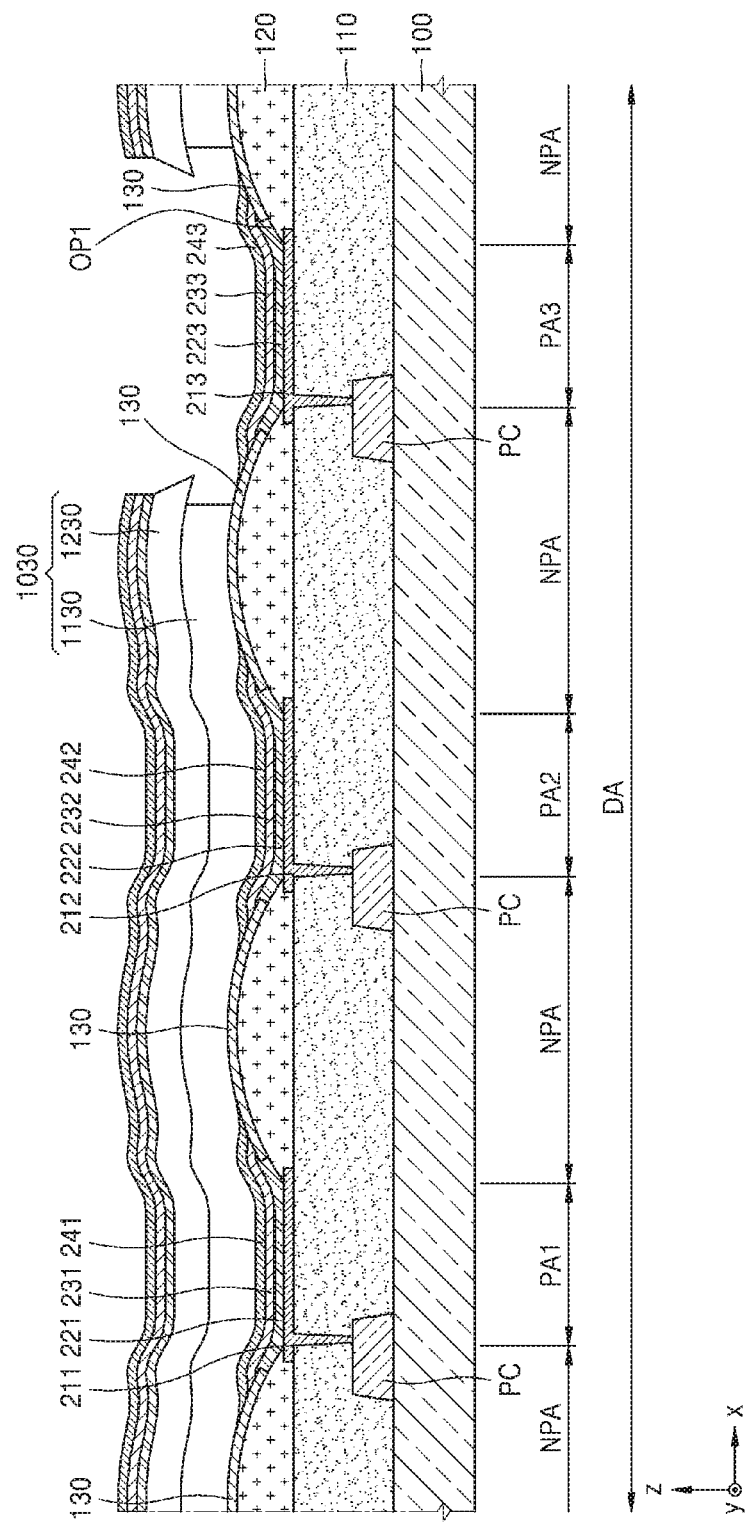

Referring to FIG. 8G, a third masking layer 1030 having an open portion corresponding to the third pixel area PA3 is formed. The third masking layer 1030 may include a third photosensitive pattern layer 1230 and a third auxiliary layer 1130, the third auxiliary layer 1130 being between the third photosensitive pattern layer 1230 and the pixel-defining layer 120. The third auxiliary layer 1130 and the third photosensitive pattern layer 1230 may respectively include the same materials as those of the first auxiliary layer 1110 and the first photosensitive pattern layer 1210, and may be formed by the same processes as those used to form the first auxiliary layer 1110 and the first photosensitive pattern layer 1210.

The third intermediate layer 223, the third opposite electrode 233, and the third passivation layer 243 are sequentially formed over the substrate 100 over which the third masking layer 1030 has been formed. Since the materials of the third intermediate layer 223, the third opposite electrode 233, and the third passivation layer 243 have been described above with reference to FIG. 3, duplicative descriptions are omitted. The third intermediate layer 223 and the third opposite electrode 233 may be formed by thermal evaporation, and the third passivation layer 243 may be formed by CVD.

Deposition materials for forming the third intermediate layer 223, the third opposite electrode 233, and the third passivation layer 243 may move toward the substrate 100 in the direction perpendicular to the substrate 100 and in the oblique direction with respect to the substrate 100. In this manner, ends of the third intermediate layer 223, the third opposite electrode 233, and the third passivation layer 243 may have forward tapered shapes without contacting the third auxiliary layer 1130.

An end of the third opposite electrode 233 may extend farther than an end of the third intermediate layer 223 such that the third opposite electrode 233 has a greater width than a width of the third intermediate layer 223, and may contact the wiring layer 130. The third opposite electrode 233 may directly contact an upper surface of the wiring layer 130 and be electrically and directly connected to the wiring layer 130. The third passivation layer 243 has a greater width than a width of the third opposite electrode 233, and, as such, may prevent the third opposite electrode 233 (and layers disposed therebelow) from being damaged.

Referring to FIG. 8H, the third masking layer 1030 is removed via a lift-off process. For example, the third photosensitive pattern layer 1230, the third intermediate layer 223, the third opposite electrode 233, and the third passivation layer 243 on the third auxiliary layer 1130 may be simultaneously removed by removing the third auxiliary layer 1130 using a fluorine-based solvent. Also, the third intermediate layer 223, the third opposite electrode 233, and the third passivation layer 243 remain in the third pixel area PA3 in island-type forms.

Figure 9:
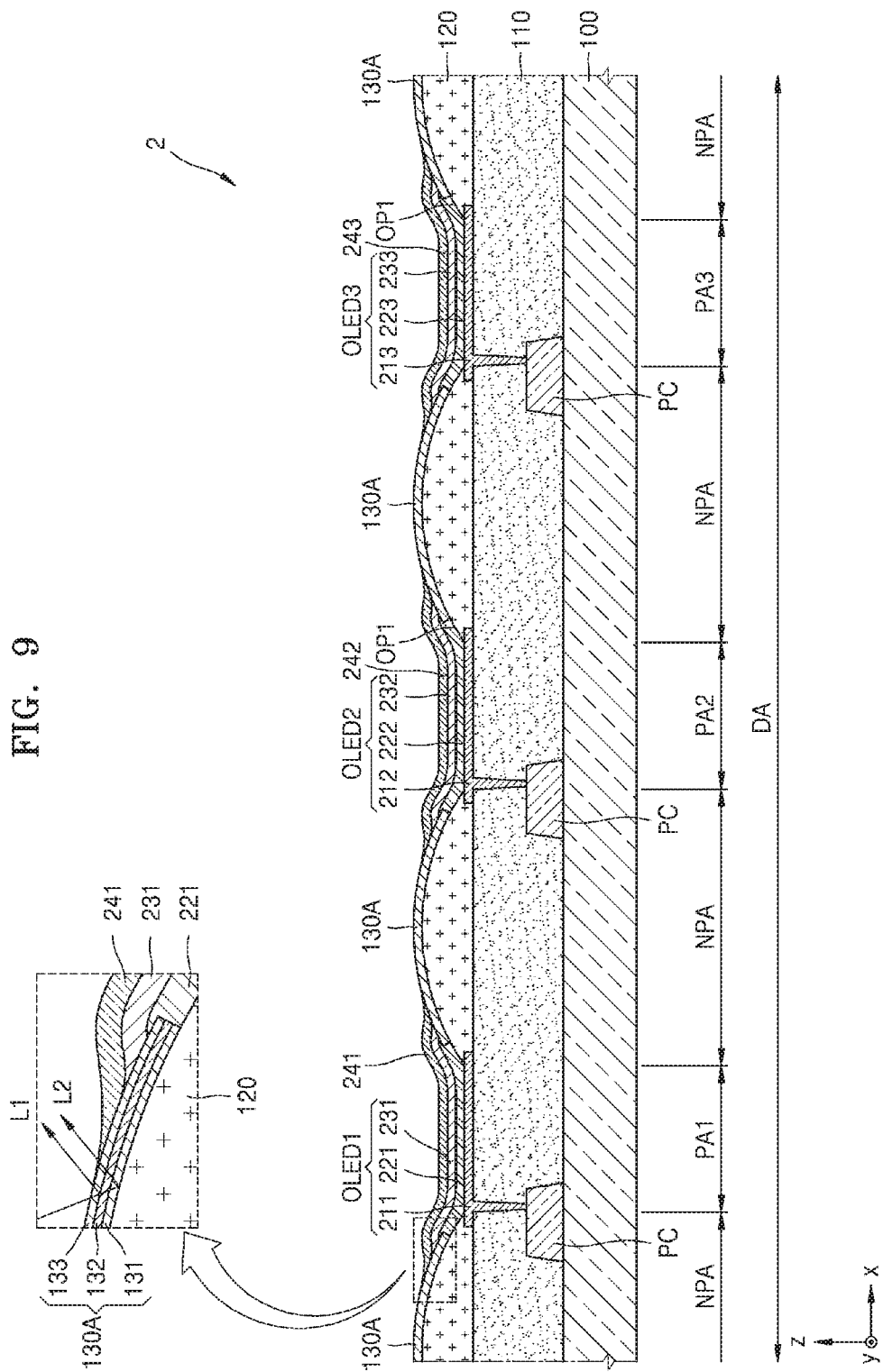
FIG. 9 is a cross-sectional view of a display device according to one or more exemplary embodiments.

FIG. 9 is a cross-sectional view of a display device according to one or more exemplary embodiments.

Referring to FIG. 9, since the display device 2 has a similar configuration as that of the display device 1 described with reference to FIG. 3 except for the configuration of a wiring layer 130A, differences are mainly described below.

The wiring layer 130A may have a multi-layered structure including a first metallic layer 131, a second metallic layer 133, and a light-transmissive layer 132 therebetween. The wiring layer 130A may prevent light incident to the display device 2 from being reflected by the wiring layer 130A, and, as such, may prevent reflected light from being viewed from the outside. For example, light L2 reflected by the first metallic layer 131 may destructively interfere with light L1 reflected by the second metallic layer 133, and, in this manner, the lights L1 and L2 may not be viewed from the outside.

Although the first metallic layer 131 and the second metallic layer 133 may include metals, such as Mo and Ti, exemplary embodiments are not limited thereto or thereby. The light-transmissive layer 132 may include a light-transmissive inorganic material, such as SiOx, or a transparent oxide. In the case where the light-transmissive layer 132 includes an insulating material, such as SiOx, the second metallic layer 133 of the wiring layer 130A may substantially serve as a wiring supplying the common voltage ELVSS to the first to third opposite electrodes 231, 232, and 233.

The wiring layer 130A may be formed after forming the first to third pixel electrodes 211, 212, and 213 as described with reference to FIG. 8B. In this case, the materials of the wiring layer 130A, for example, the first metallic layer 131, the second metallic layer 133, and the light-transmissive layer 132 may include materials having etching selectivity different from that of materials of the first to third pixel electrodes 211, 212, and 213.

Figure 10:
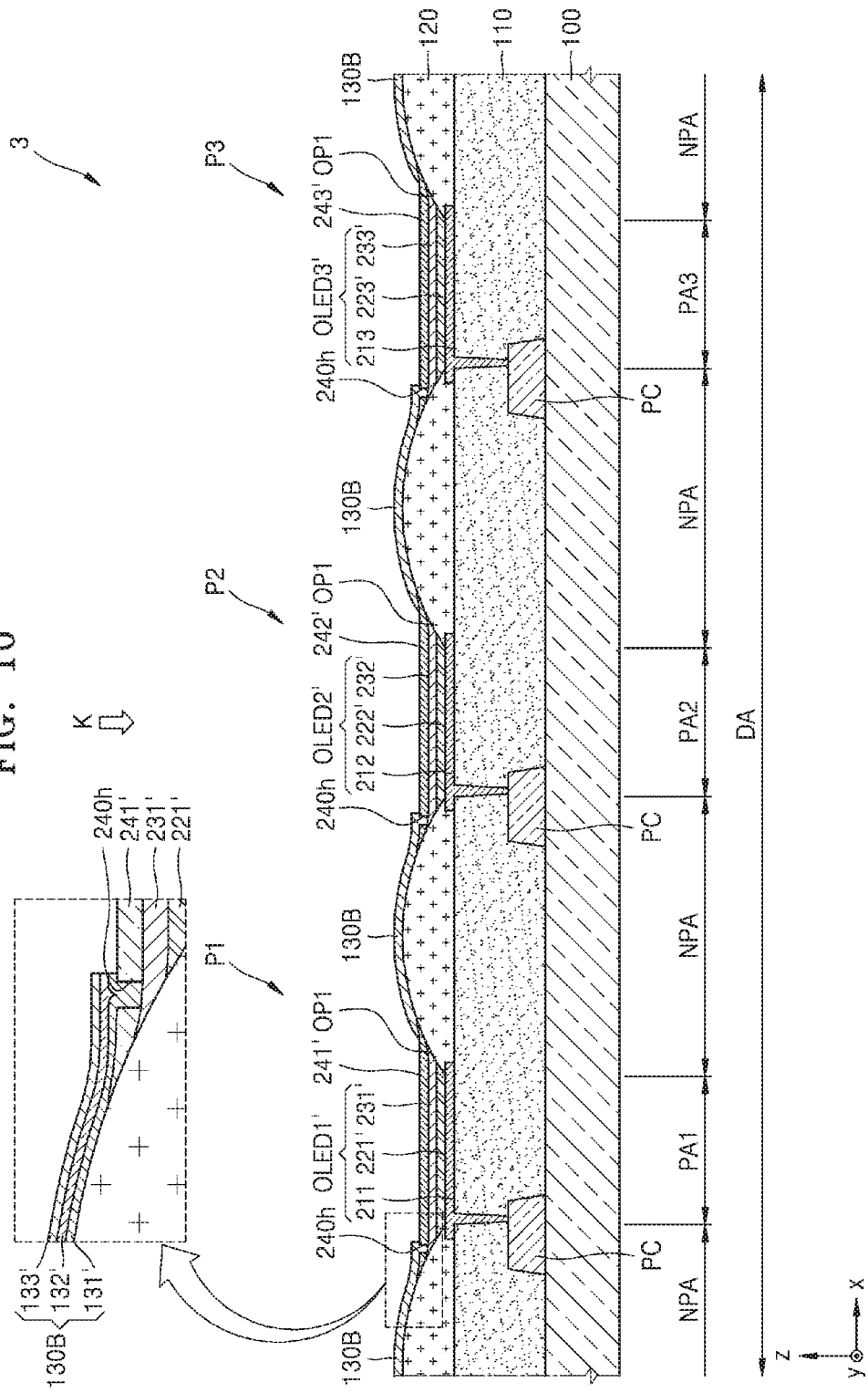
FIG. 10 is a cross-sectional view of a display device according to one or more exemplary embodiments.
Figure 11:
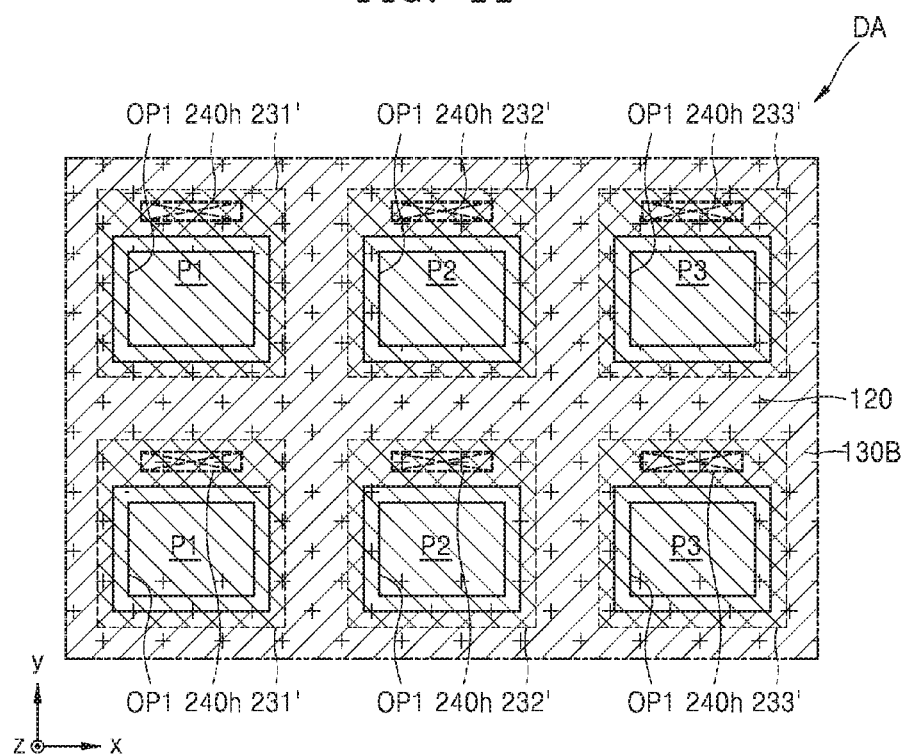
FIG. 11 is a plan view of the display device of FIG. 10 viewed in a direction K according to one or more exemplary embodiments.
Figure 12:
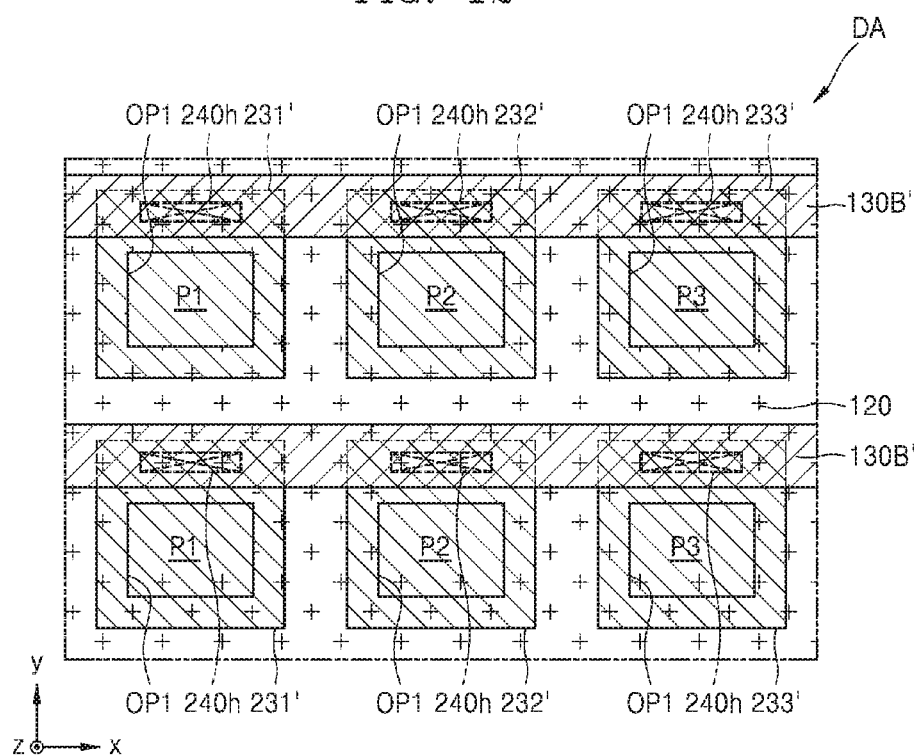
FIG. 12 is a plan view of the display device of FIG. 10 viewed in the direction K according to one or more exemplary embodiments.

FIG. 10 is a cross-sectional view of a display device according to one or more exemplary embodiments. FIG. 11 is a plan view of the display device of FIG. 10 viewed in a direction K according to one or more exemplary embodiments. FIG. 12 is a plan view of the display device of FIG. 10 viewed in the direction K according to one or more exemplary embodiments. For convenience of description, FIGS. 11 and 12 illustrate only the pixel-defining layer 120, the wiring layer 130B, and the first to third opposite electrodes 231', 232', and 233' of the display device of FIG. 10. The display devices of FIGS. 10 to 12 are similar to the display devices of FIGS. 3, 5, and 6, and, as such, primarily differences are described below.

Referring to FIG. 10, the display device 3 includes the substrate 100, the circuit element layer 110 including the pixel circuit PC, the first to third organic light-emitting diodes OLED1', OLED2', and OLED3', and the first to third passivation layers 241', 242', and 243'.

The first to third organic light-emitting diodes OLED1', OLED2', and OLED3' respectively include the first to third pixel electrodes 211, 212, and 213, the first to third intermediate layers 221', 222', and 223', and the first to third opposite electrodes 231', 232', and 233'. The first to third organic light-emitting diodes OLED1', OLED2', and OLED3' are respectively covered with the first to third passivation layers 241', 242', and 243'. The first to third passivation layers 241', 242', and 243' may be single layers or multi-layers including an inorganic insulating material, such as SiOx, SiNx, and/or SiON.

The substrate 100 and the first to third organic light-emitting diodes OLED1', OLED2', and OLED3' of the display device 3 have been described with reference to FIGS. 3 and 4, and the circuit element layer 110 has been described with reference to FIGS. 7A and 7B. As such, differences are mainly described below.

The wiring layer 130B is disposed on the pixel-defining layer 120 in the non-pixel areas NPA. Portions of the wiring layer 130B respectively extend on the first to third passivation layers 241', 242', and 243'. The portions of the wiring layer 130B that respectively overlap the first to third opposite electrodes 231', 232', and 233' may contact the first to third opposite electrodes 231', 232', and 233' via contact holes 240h which are formed in the first to third passivation layers 241', 242', and 243'. For example, the wiring layer 130B may directly contact upper surfaces of the first to third opposite electrodes 231', 232', and 233' via the contact holes 240h.

As illustrated in FIGS. 11 and 12, the contact holes 240h may respectively correspond to edges of the first to third opposite electrodes 231', 232', and 233'. For example, the contact holes 240h may respectively expose ends of the first to third opposite electrodes 231', 232', and 233' in the non-pixel areas NPA in which the pixel-defining layers 120 are respectively arranged.

The wiring layers 130B or 130B' overlap portions of the first to third opposite electrodes 231', 232', and 233' and directly contact the portions of the first to third opposite electrodes 231', 232', and 233' via the contact holes 240h. In this manner, the first to third opposite electrodes 231', 232', and 233' having an island-type form and spaced apart from each other may be electrically connected through the wiring layer 130B or 130B', and receive the common voltage ELVSS.

Although the wiring layer 130B and 130B' may be patterned to have a mesh form as illustrated in FIG. 11 or to have a striped form as illustrated in FIG. 12, exemplary embodiments are not limited thereto or thereby.

Referring to FIG. 10 again, the wiring layer 130B includes a conductive material.

According to one or more exemplary embodiments, as illustrated in an enlarged portion of FIG. 10, the wiring layer 130B may have a multi-layered structure including the first metallic layer 131', the second metallic layer 133', and the light-transmissive layer 132' disposed therebetween. Since light L2 (shown in FIG. 9) reflected by the first metallic layer 131' may destructively interfere with light L1 (shown in FIG. 9) reflected by the second metallic layer 133' such that the light L1 and L2 is not viewed by an external user, reflection of external light may be reduced. Although the first metallic layer 131' and the second metallic layer 133' may include metal, such as Mo and Ti, exemplary embodiments are not limited thereto or thereby. The light-transmissive layer 132' may include a light-transmissive inorganic material, such as SiOx, or a TCO. In the case where the light-transmissive layer 132' includes an insulating material, such as SiOx, the first metallic layer 131' of the wiring layer 130B may substantially serve as a wiring to supply the common voltage ELVSS to the first to third opposite electrodes 231', 232', and 233'.

In one or more exemplary embodiments, the wiring layer 130B may be a single layer or a multi-layer including metal or may be a single layer or a multi-layer including a transparent oxide. Since the wiring layer 130B is formed after the first to third passivation layers 241', 242', and 243' are formed, the wiring layer 130B may include a material which is the same as or different from that of the first to third pixel electrodes 211, 212, and 213.

FIGS. 13A to 13F are cross-sectional views of the display device of FIG. 10 at various stages of manufacture according to one or more exemplary embodiments.

Figure 13A:
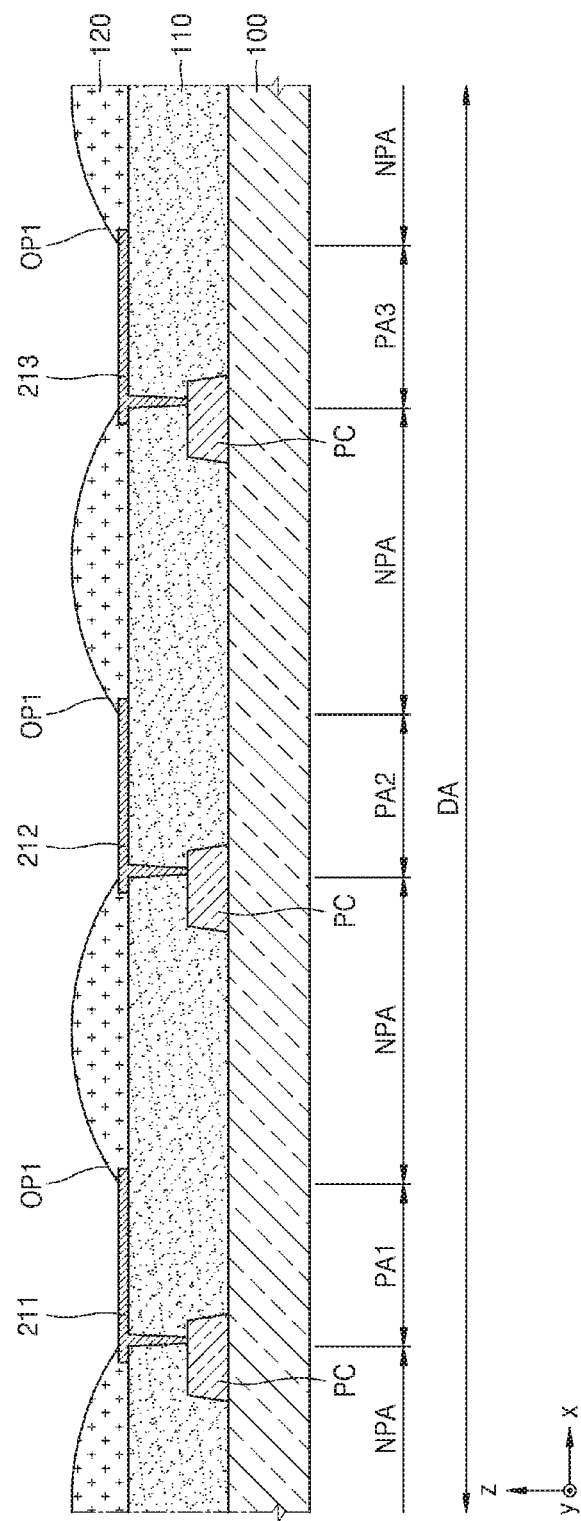

Referring to FIG. 13A, after the circuit element layer 110 and the first to third pixel electrodes 211, 212, and 213 are sequentially formed over the substrate 100, the pixel-defining layer 120 including the openings OP1 exposing the first to third pixel electrodes 211, 212, and 213 is formed. Since processes for forming the circuit element layer 110, the first to third pixel electrodes 211, 212, and 213, and the pixel-defining layer 120 have been described above with reference to FIG. 8A, duplicative descriptions are omitted.

Referring to FIG. 13B, after the first masking layer 1010 including the open portion corresponding to the first pixel area PA1 is formed, the first intermediate layer 221', the first opposite electrode 231', and the first passivation layer 241' are sequentially formed. Also, the first intermediate layer 221', the first opposite electrode 231', and the first passivation layer 241' arranged as island types are formed in the first pixel area PA1 by removing the first masking layer 1010 via a lift-off process.

Since the material and the structure of the first masking layer 1010; the process of forming the first intermediate layer 221', the first opposite electrode 231', and the first passivation layer 241'; the lift-off process, etc. are the same as those described above with reference to FIGS. 8C and 8D, duplicative descriptions are omitted.

Figure 13C:
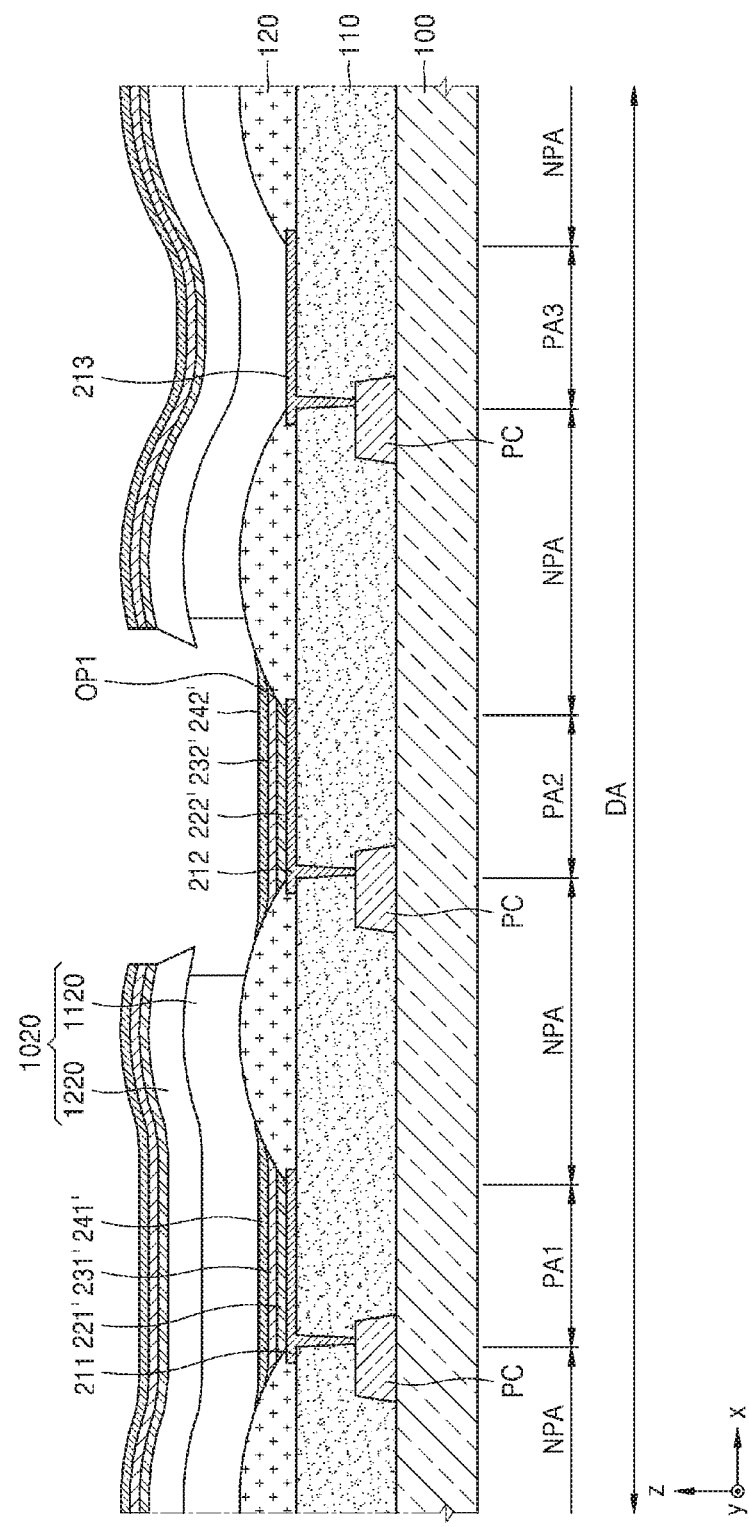

Referring to FIG. 13C, after the second masking layer 1020 including the open portion corresponding to the second pixel area PA2 is formed, the second intermediate layer 222', the second opposite electrode 232', and the second passivation layer 242' are sequentially formed. Also, the second intermediate layer 222', the second opposite electrode 232', and the second passivation layer 242' arranged as island types are formed in the second pixel area PA2 by removing the second masking layer 1020 via a lift-off process.

Since the material and the structure of the second masking layer 1020; the process of forming the second intermediate layer 222', the second opposite electrode 232', and the second passivation layer 242'; the lift-off process, etc. are the same as those described above with reference to FIGS. 8E and 8F, duplicative descriptions are omitted.

Figure 13D:
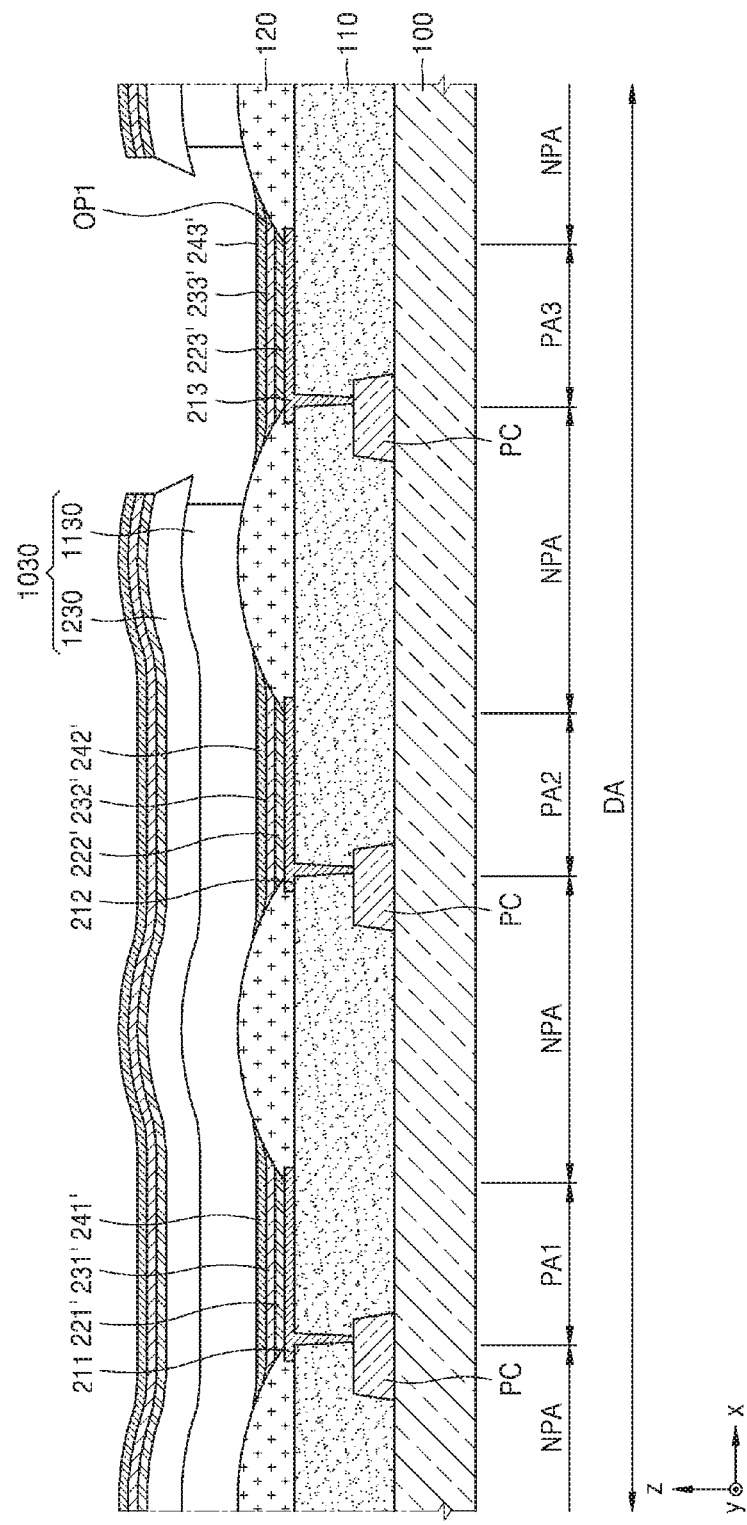

Referring to FIG. 13D, after the third masking layer 1030 including the open portion corresponding to the third pixel area PA3 is formed, the third intermediate layer 223', the third opposite electrode 233', and the third passivation layer 243' are sequentially formed. Also, the third intermediate layer 223', the third opposite electrode 233', and the third passivation layer 243' arranged as island types are formed in the third pixel area PA3 by removing the third masking layer 1030 via a lift-off process.

Since the material and the structure of the third masking layer 1030; the process of forming the third intermediate layer 223', the third opposite electrode 233', and the third passivation layer 243'; the lift-off process, etc. are the same as those described above with reference to FIG. 8G, duplicative descriptions are omitted.

Figure 13E:
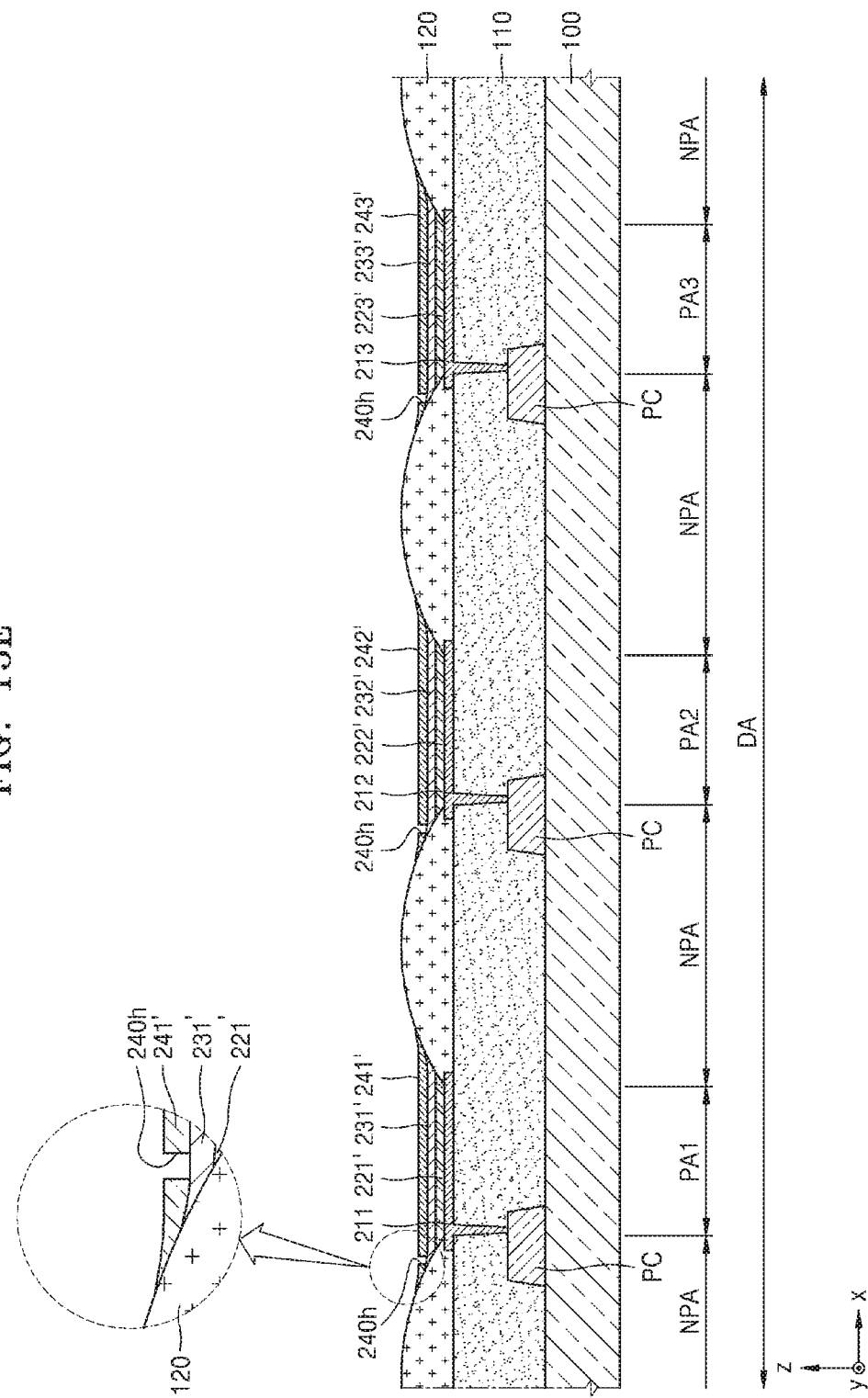

Referring to FIG. 13E, the contact holes 240h are formed in the first to third passivation layers 241', 242', and 243'. The first to third opposite electrodes 231', 232', and 233' are exposed via the contact holes 240h. For example, the contact holes 240h may expose ends (e.g., edges) of the first to third opposite electrodes 231', 232', and 233' in the non-pixel areas NPA.

Figure 13F:
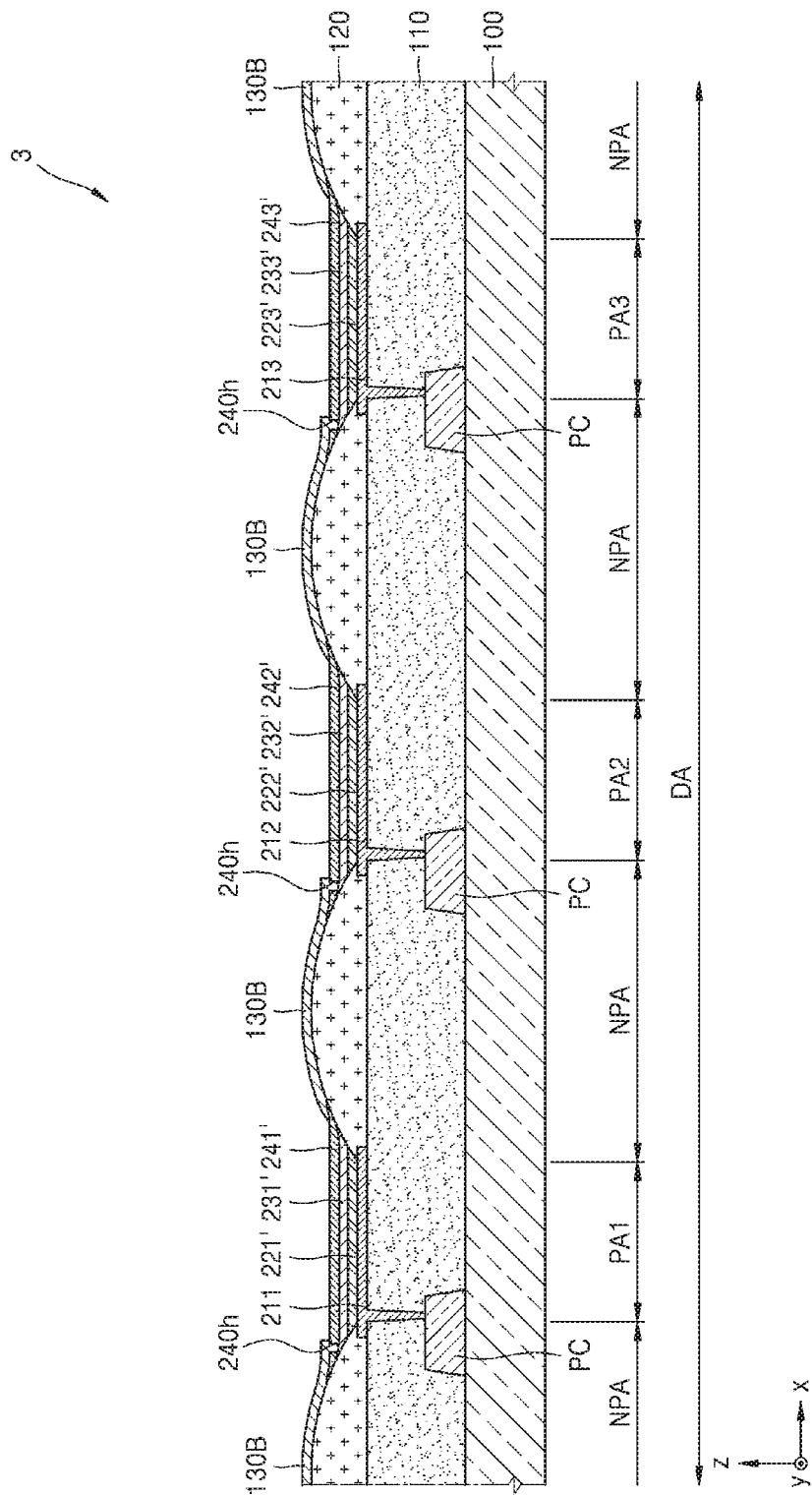

Referring to FIG. 13F, the wiring layer 130B is formed by forming a conductive material layer (not shown) and patterning the same. The wiring layer 130B may be formed by photolithography and wet or dry etching. The wiring layer 130B may contact the first to third opposite electrodes 231', 232', and 233' via the contact holes 240h.

Since the wiring layer 130B is formed after the first to third passivation layers 241', 242', and 243' are formed, the wiring layer 130B may include various materials without limitation unlike the wiring layer 130A described above with reference to FIG. 9.

Figure 14:
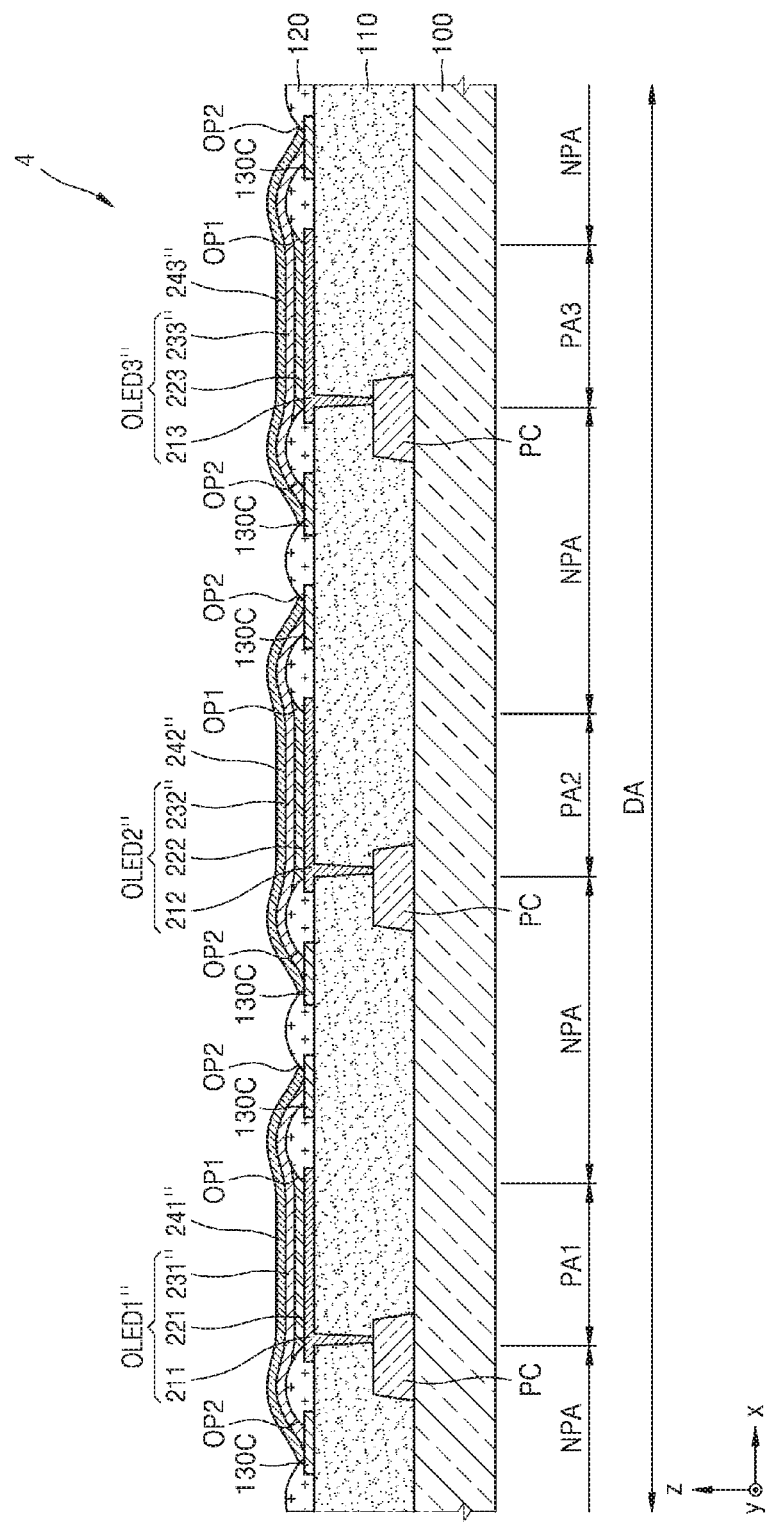
FIG. 14 is a cross-sectional view of a display device according to one or more exemplary embodiments.

FIG. 14 is a cross-sectional view of a display device according to one or more exemplary embodiments.

Referring to FIG. 14, the display device 4 includes the substrate 100, the circuit element layer 110 including the pixel circuit PC, the first to third organic light-emitting diodes OLED1", OLED2", and OLED3", the first to third passivation layers 241", 242", and 243", and a wiring layer 130C. Since the substrate 100 and the circuit element layer 110 are the same as those described above, differences are mainly described below.

The wiring layer 130C may be disposed on the circuit element layer 110 in the non-pixel area NPA. The wiring layer 130C may be disposed in the same layer in which the first to third pixel electrodes 211, 212, and 213 are disposed. Elements being disposed in the same layer means, for the purposes of this disclosure, that layers directly under the elements are the same each other or layers directly on the elements are the same each other. For example, the wiring layer 130C and the first to third pixel electrodes 211, 212, and 213 may be disposed between the circuit element layer 110 and the pixel-defining layer 120 and contact the circuit element layer 110 and the pixel-defining layer 120. The wiring layer 130C may include the same material as that of the first to third pixel electrodes 211, 212, and 213.

The pixel-defining layer 120 may cover ends of the first to third pixel electrodes 211, 212, and 213 and ends of the wiring layer 130C. The pixel-defining layer 120 may include the openings OP1 exposing the first to third pixel electrodes 211, 212, and 213 and additional openings OP2 exposing the wiring layer 130C.

The first to third intermediate layers 221, 222, and 223 are disposed respectively on the first to third pixel electrodes 211, 212, and 213 exposed via the openings OP1. The first to third opposite electrodes 231", 232", and 233" may have widths greater than those of the first to third intermediate layers 221, 222, and 223.

The first to third opposite electrodes 231", 232", and 233" extend toward portions of the wiring layer 130C respectively adjacent to the first to third pixel electrodes 211, 212, and 213 to overlap and directly contact at least the portions of the wiring layer 130C exposed via the additional openings OP2. For example, the first to third opposite electrodes 231", 232", and 233" may cover portions of the pixel-defining layers 120 disposed between the pixel areas PA1, PA2, and PA3 and the wiring layer 130C, and the first to third opposite electrodes 231", 232", and 233" may extend to contact the wiring layer 130C.

Although FIG. 14 illustrates a structure in which the first to third opposite electrodes 231", 232", and 233" overlap and contact portions of the wiring layer 130C, the first to third opposite electrodes 231", 232", and 233" may entirely overlap the wiring layer 130C (or entirely cover the wiring layer 130C) exposed via the additional openings OP2 and directly contact the wiring layer 130C.

The first to third passivation layers 241", 242", and 243" respectively cover the first to third opposite electrodes 231", 232", and 233". The first to third passivation layers 241", 242", and 243" have widths greater than those of the first to third opposite electrodes 231", 232", and 233". For example, ends of the first to third passivation layers 241", 242", and 243" may extend farther than those of the first to third opposite electrodes 231", 232", and 233".

Although not shown, as described above, the wiring layer 130C may have various patterns, such as a mesh form or a striped form in a plan view.

FIGS. 15A to 15E are cross-sectional views of the display device of FIG. 14 at various stages of manufacture according to one or more exemplary embodiments.

Figure 15A:
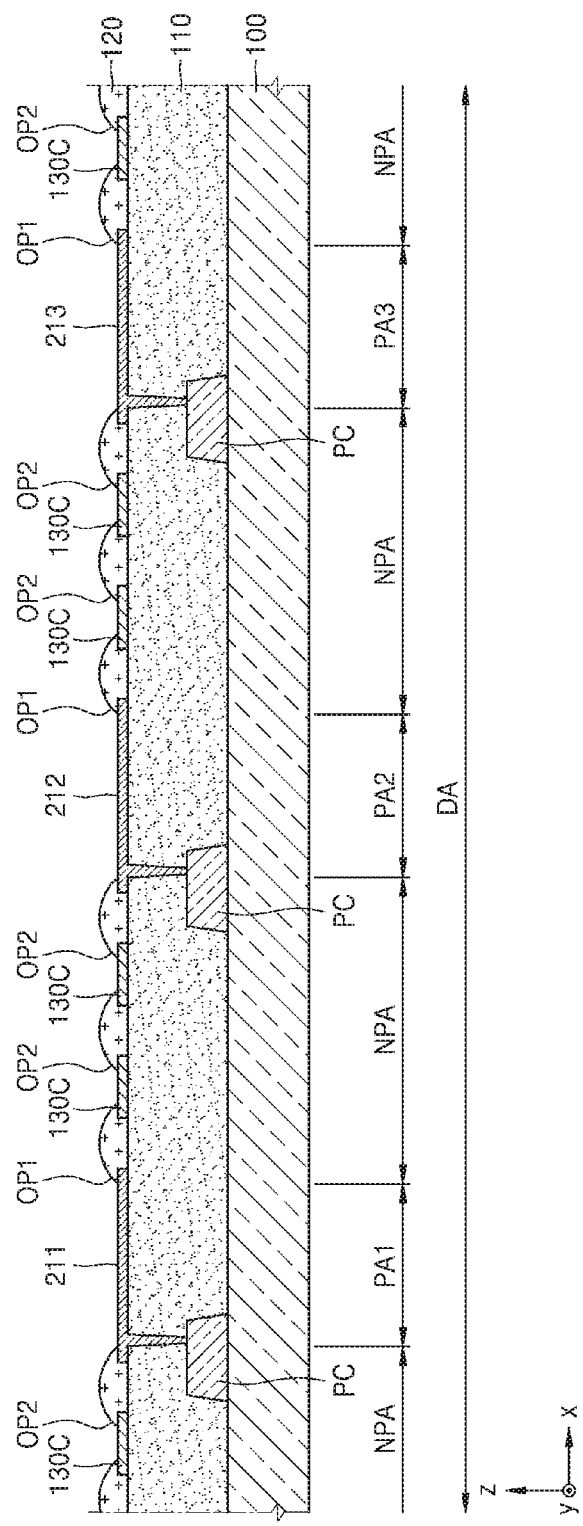

Referring to FIG. 15A, after the circuit element layer 110 is formed on the substrate 100, the first to third pixel electrodes 211, 212, and 213 and the wiring layer 130C are formed on the circuit element layer 110. The first to third pixel electrodes 211, 212, and 213 respectively correspond to the first to third pixel areas PA1, PA2, and PA3. The wiring layer 130C corresponds to the non-pixel area NPA. For example, the first to third pixel electrodes 211, 212, and 213 and the wiring layer 130C may be formed by forming a preliminary pixel electrode layer (not shown) on the circuit element layer 110 and patterning the same. Materials of the first to third pixel electrodes 211, 212, and 213 are the same as those described above with reference to FIG. 3, and the wiring layer 130C includes the same material as that of the first to third pixel electrodes 211, 212, and 213.

The pixel-defining layer 120 including the openings OP1 and the additional openings OP2 is formed by forming an insulating material layer (not shown) and patterning the same, the openings OP1 respectively exposing portions of the first to third pixel electrodes 211, 212, and 213, and the additional openings OP2 respectively exposing portions of the wiring layer 130C. An insulating material of the insulating material layer used to form the pixel-defining layer 120 may be an organic material. In one or more exemplary embodiments, the insulating material may be an inorganic material, or may include an organic material and an inorganic material.

Figure 15B:
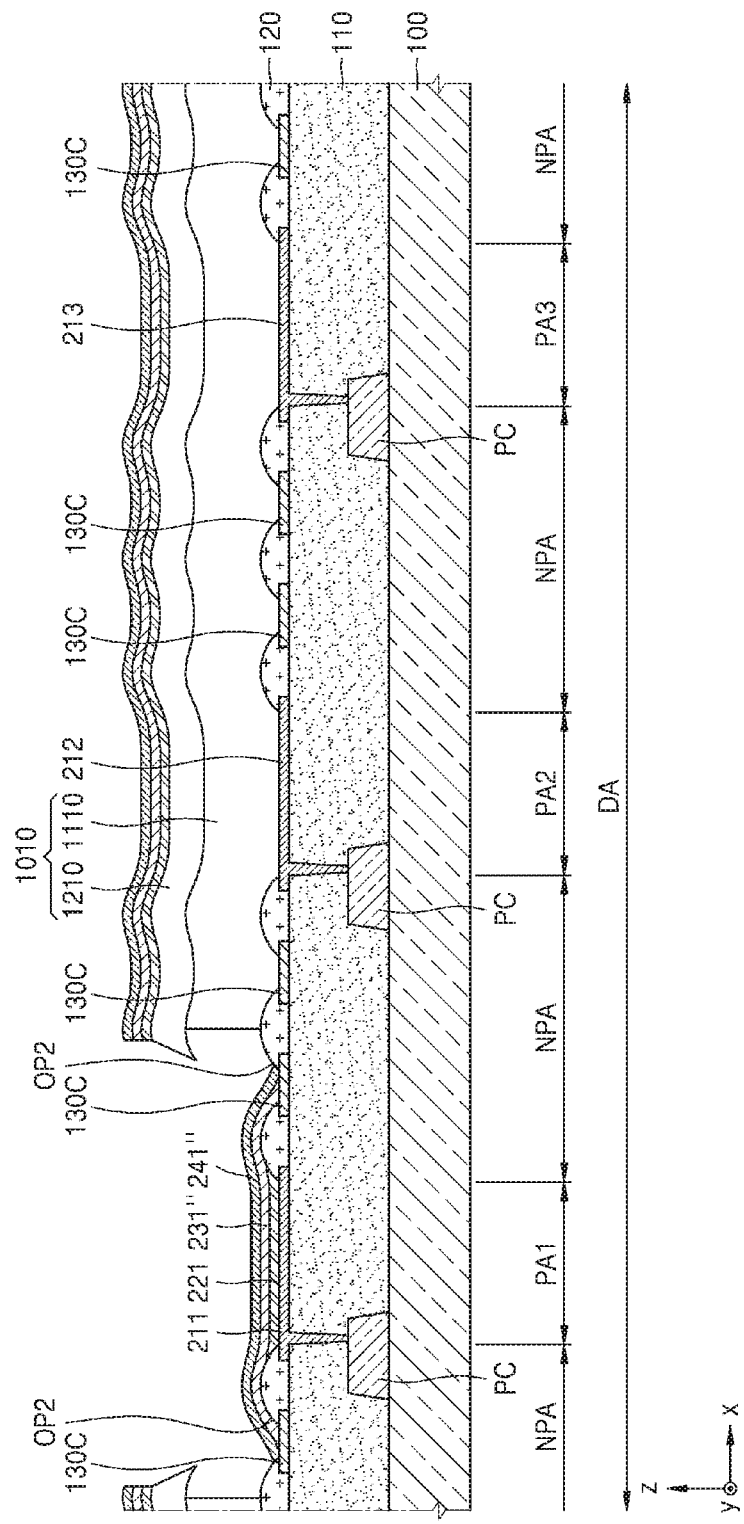

Referring to FIG. 15B, the first masking layer 1010 is formed, the first masking layer 1010 including an open portion corresponding to the first pixel area PA1 and a portion of the non-pixel area NPA adjacent to the first pixel area PA1. The first masking layer 1010 may include the first photosensitive pattern layer 1210 and the first auxiliary layer 1110, the first auxiliary layer 1110 being disposed between the first photosensitive pattern layer 1210 and the pixel-defining layer 120. The first pixel electrode 211 and the portion of the wiring layer 130C adjacent to the first pixel electrode 211 are exposed via the open portion of the first masking layer 1010, and remaining portions of the wiring layer 130C are covered by the first masking layer 1010. Since the structure and the materials of the first masking layer 1010 and the process of forming the first masking layer 1010 have been described above with reference to FIG. 8C, duplicative descriptions are omitted.

The first intermediate layer 221, the first opposite electrode 231", and the first passivation layer 241" are sequentially formed over the substrate 100 over which the first masking layer 1010 has been formed.

While deposition materials of the first intermediate layer 221 and the first opposite electrode 231" move toward the substrate 100 in the direction perpendicular to the substrate 100 and in the oblique direction with respect to the substrate 100, an end of the first intermediate layer 221 and an end of the first opposite electrode 231" may extend to a space below the first photosensitive pattern layer 1210 without contacting the first auxiliary layer 1110. The first intermediate layer 221 is formed on the first pixel electrode 211 exposed via the opening OP1. The first opposite electrode 231" has a width greater than that of the first intermediate layer 221. An end of the first opposite electrode 231" extends farther than an end of the first intermediate layer 221, overlaps at least the portion of the wiring layer 130C exposed via the open portion of the first masking layer 1010, and directly contacts the wiring layer 130C. The first passivation layer 241 covers the first opposite electrode 231" and has a width greater than that of the first opposite electrode 231".

The first masking layer 1010 is removed via a lift-off process. The first intermediate layer 221, the first opposite electrode 231", and the first passivation layer 241" are disposed in the first pixel area PA1. An end of the first opposite electrode 231" overlapping the portion of the wiring layer 130C may directly contact the wiring layer 130C.

Referring to FIG. 15C, the second masking layer 1020 is formed. The second masking layer 1020 includes an open portion corresponding to the second pixel area PA2 and a portion of the non-pixel area NPA adjacent to the second pixel area PA2. The second pixel electrode 212 and the portion of the wiring layer 130C adjacent to the second pixel electrode 212 are exposed via the open portion in the second masking layer 1020, remaining portions of the wiring layer 130C are covered by the second masking layer 1020. Since the structure and the material of the second masking layer 1020, and the process of forming the second masking layer 1020 have been described with reference to FIG. 8F, duplicative descriptions are omitted.

The second intermediate layer 222, the second opposite electrode 232", and the second passivation layer 242" are sequentially formed over the substrate 100 over which the second masking layer 1020 has been formed.

The second intermediate layer 222 is formed on the second pixel electrode 212 exposed via the opening OP1. The second opposite electrode 232" has a width greater than that of the second intermediate layer 222. An end of the second opposite electrode 232" extends farther than an end of the second intermediate layer 222, overlaps at least the portion of the wiring layer 130C exposed via the open portion of the second masking layer 1020, and directly contacts the wiring layer 130C. The second passivation layer 242" covers the second opposite electrode 232" and has a width greater than that of the second opposite electrode 232".

The second masking layer 1020 is removed via the lift-off process. The second intermediate layer 222, the second opposite electrode 232", and the second passivation layer 242" are disposed in the second pixel area PA2. An end of the second opposite electrode 232" overlapping the portion of the wiring layer 130C may directly contact the wiring layer 130C.

Figure 15D:
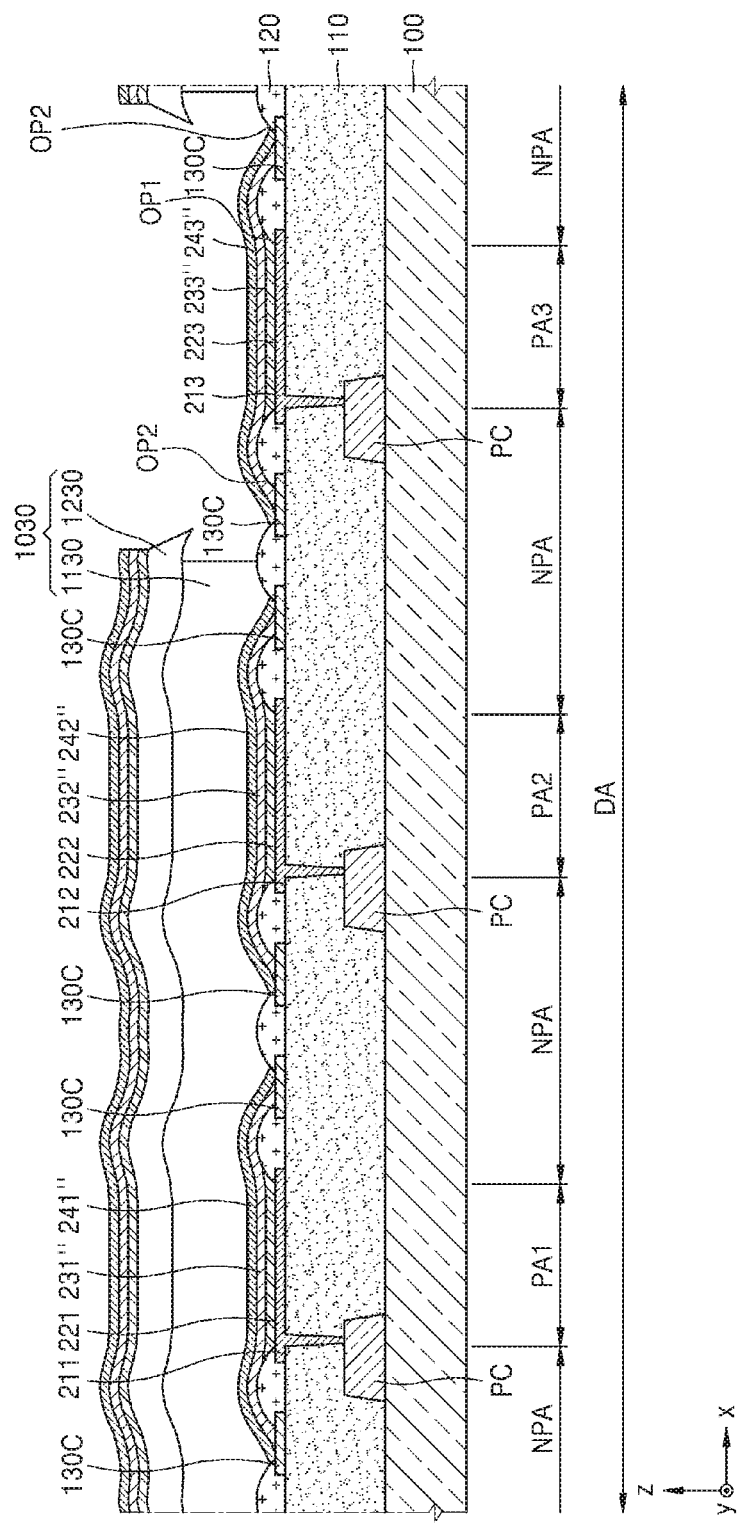

Referring to FIG. 15D, the third masking layer 1030 is formed. The third masking layer 1030 includes an open portion corresponding to the third pixel area PA3 and a portion of the non-pixel area NPA adjacent to the third pixel area PA3. The third pixel electrode 213 and the portion of the wiring layer 130C adjacent to the third pixel electrode 213 are exposed via the open portion of the third masking layer 1030, and remaining portions of the wiring layer 130C are covered by the third masking layer 1030. Since the structure and the material of the third masking layer 1030 and the process of forming the third masking layer 1030 have been described above with reference to FIG. 8G, duplicative descriptions are omitted.

The third intermediate layer 223, the third opposite electrode 233", and the third passivation layer 243" are sequentially formed over the substrate 100 over which the third masking layer 1030 has been formed.

The third intermediate layer 223 is formed on the third pixel electrode 213 exposed via the opening OP1. The third opposite electrode 233" has a width greater than that of the third intermediate layer 223. An end of the third opposite electrode 233" extends farther than an end of the third intermediate layer 223, overlaps at least the portion of the wiring layer 130C exposed via the open portion of the third masking layer 1030, and directly contacts the wiring layer 130C. The third passivation layer 243" covers the third opposite electrode 233" and has a width greater than that of the third opposite electrode 233".

The third masking layer 1030 is removed via the lift-off process. The third intermediate layer 223, the third opposite electrode 233", and the third passivation layer 243" are disposed in the third pixel area PA3. An end of the third opposite electrode 233" overlapping the portion of the wiring layer 130C may directly contact the wiring layer 130C.

Figure 15E:
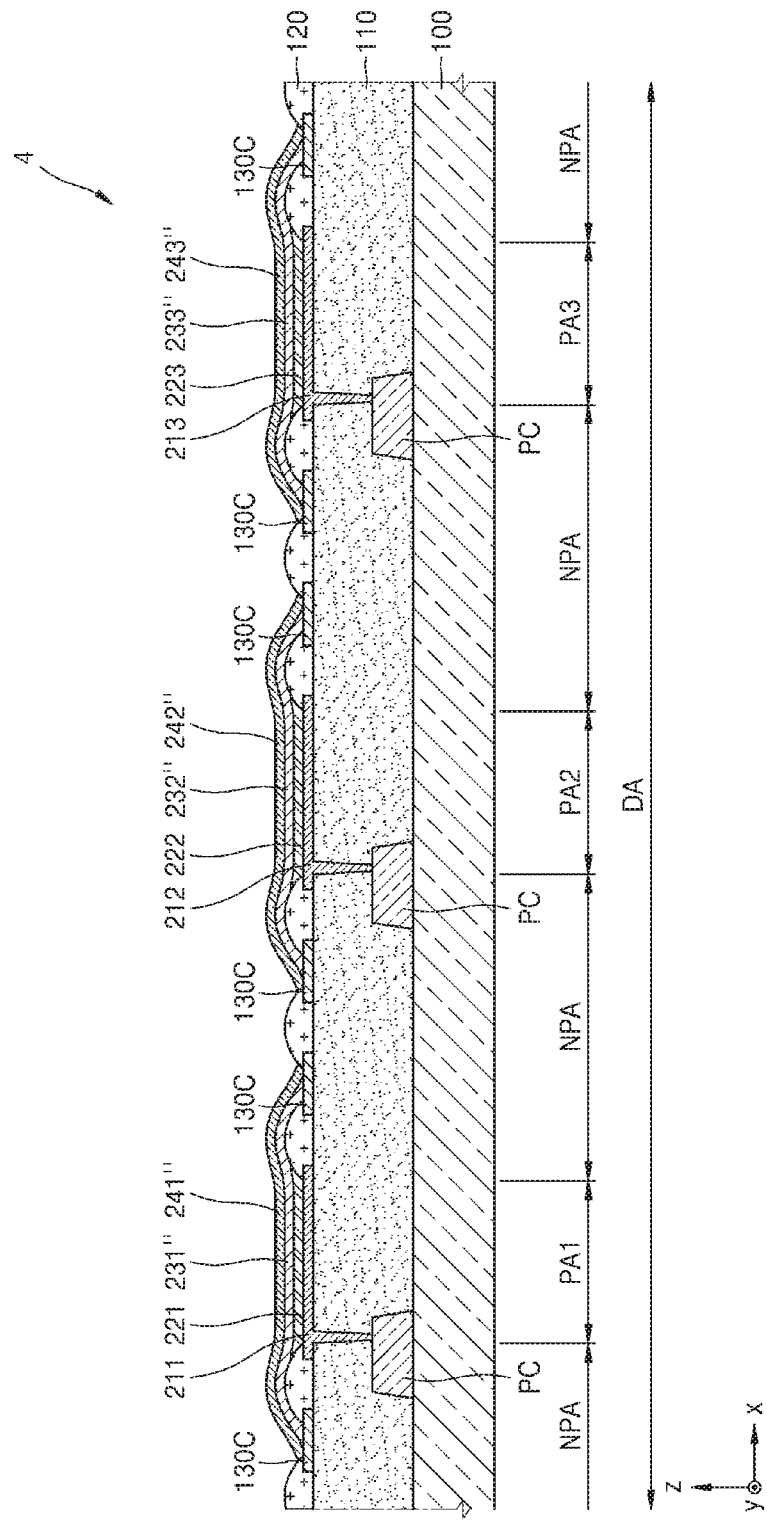

Referring to FIG. 15E, the first to third opposite electrodes 231", 232", and 233" of the first to third pixel areas PA1, PA2, and PA3 respectively overlap portions of the wiring layer 130C, directly contact the wiring layer 130C, are electrically connected to each other, and receive the same common voltage ELVSS via the above-described processes.

Figure 16:
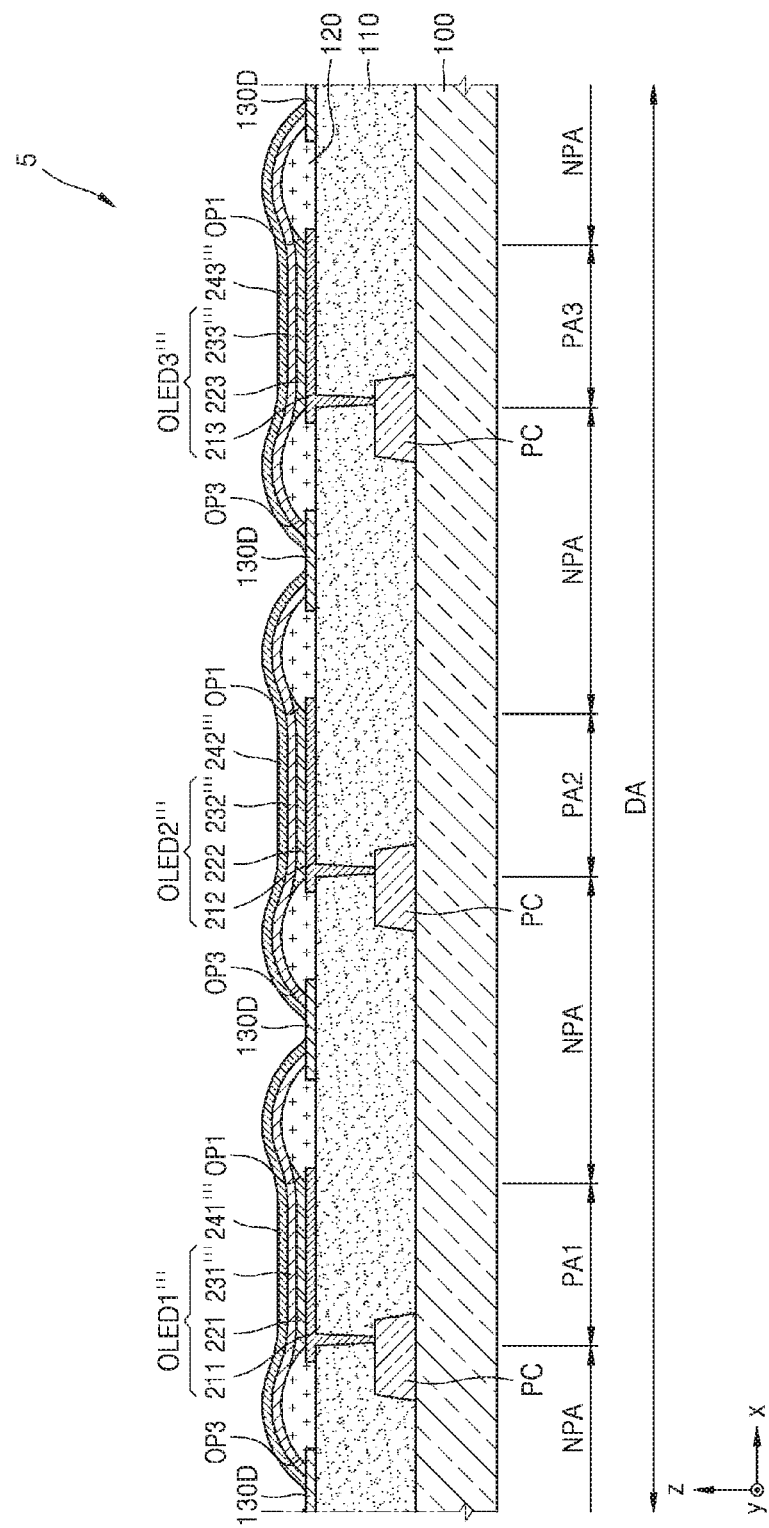
FIGS. 16 and 17 are cross-sectional views of display devices according to various exemplary embodiments.
Figure 17:
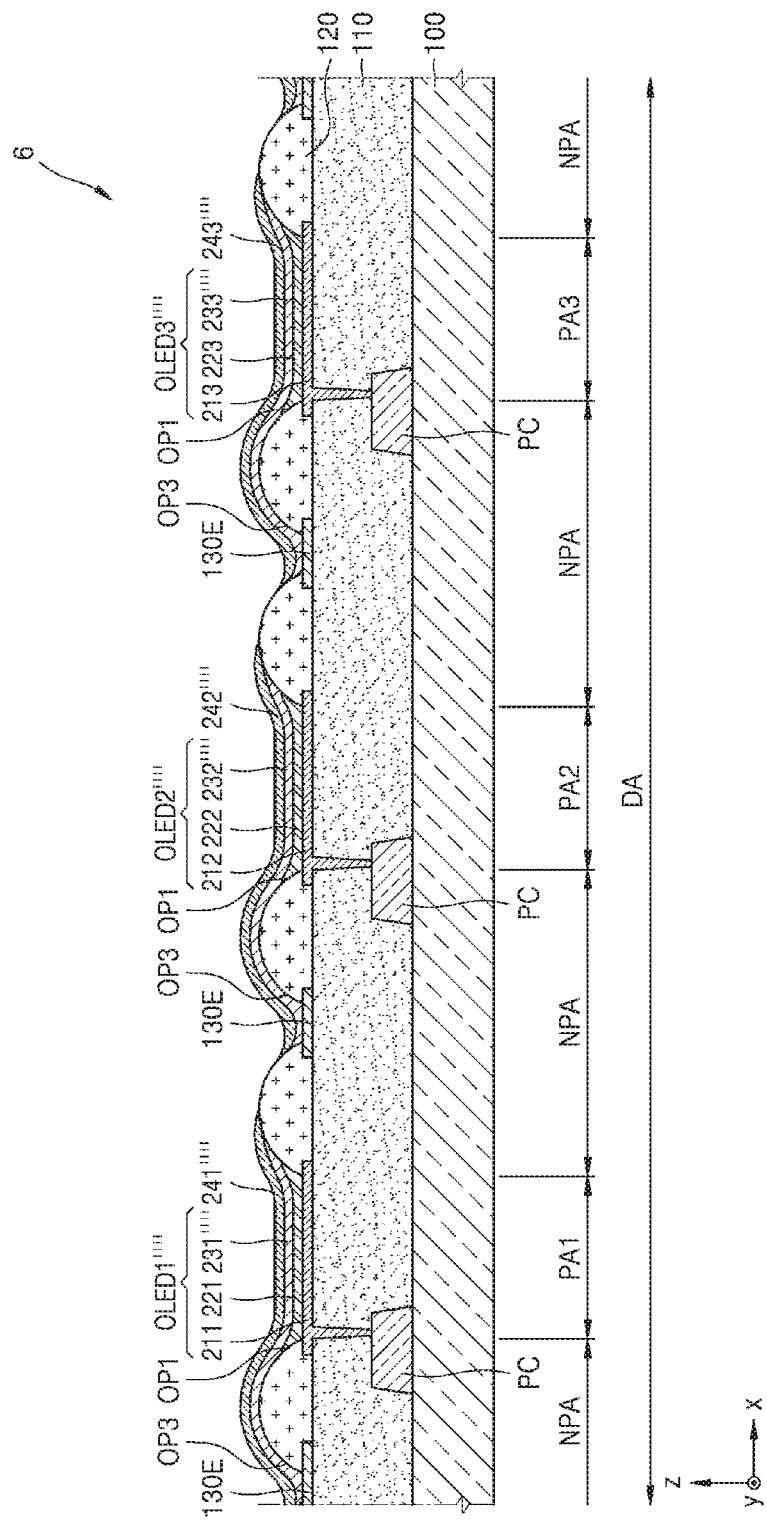

FIGS. 16 and 17 are cross-sectional views of display devices according to various exemplary embodiments. Since display devices 5 and 6 of FIGS. 16 and 17 are different from each other with respect to structures of wiring layers 130D and 130E, but are similar to display devices 1 to 4 with respect to other features, differences are mainly described below.

The wiring layer 130D or 130E disposed on the circuit element layer 110 and the additional openings OP3 of the pixel-defining layer 120 exposing the wiring layer 130D or 130E may be provided in various forms. In one or more exemplary embodiments, one or more portions of the wiring layer 130D or 130E, in cross-sectional view, may be disposed between pixel areas neighboring each other.

Referring to FIG. 16, one portion of the wiring layer 130D may be disposed between pixel areas (e.g., the first and second pixel areas PA1 and PA2) neighboring each other, and one of the additional openings OP3 of the pixel-defining layer 120 may expose the portion of the wiring layer 130D.

In one or more exemplary embodiments, an upper surface of the wiring layer 130D exposed via each of the additional openings OP3 may contact all of opposite electrodes of neighboring pixels. For example, an upper surface of the wiring layer 130D disposed between the first and second pixel areas PA1 and PA2 may directly contact the first opposite electrode 231''' and the second opposite electrode 232'''. An upper surface of the wiring layer 130D disposed between the second and third pixel areas PA2 and PA3 may directly contact the second opposite electrode 232''' and the third opposite electrode 233'''.

Referring to FIG. 17, in one or more exemplary embodiments, an upper surface of the wiring layer 130E exposed via one of additional openings OP3 may contact an opposite electrode of one neighboring pixel area. For example, an upper surface of the wiring layer 130E disposed between the first pixel area PA1 and a zeroth pixel area (not shown), which is disposed on the left side of the first pixel area PA1, may directly contact the first opposite electrode 231'''', and an upper surface of the wiring layer 130E disposed between the first and second pixel areas PA1 and PA2 may directly contact the second opposite electrode 232''''. Also, an upper surface of the wiring layer 130E disposed between the second and third pixel areas PA2 and PA3 may directly contact the third opposite electrode 233''''.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:
1. A display device comprising:
   a substrate comprising a first pixel area and a second pixel area, the first pixel area being spaced apart from the second pixel area by a non-pixel area;
   a first pixel electrode overlapping the first pixel area;
   a second pixel electrode overlapping the second pixel area;
   a pixel-defining layer comprising a first opening overlapping the first pixel electrode and a second opening overlapping the second pixel electrode;
   a first intermediate layer on the first pixel electrode, the first intermediate layer comprising a first emission layer;
   a second intermediate layer on the second pixel electrode, the second intermediate layer comprising a second emission layer spaced apart from the first emission layer;
   a first opposite electrode on the first intermediate layer;
   a second opposite electrode on the second intermediate layer, the second opposite electrode being spaced apart from the first opposite electrode; and a wiring layer overlapping the non-pixel area, the wiring layer contacting respective portions of the first opposite electrode and the second opposite electrode, wherein the wiring layer comprises:
  a first opening region corresponding to the first pixel area; and
  a second opening region corresponding to the second pixel area, and wherein, in a direction normal to the substrate, at least one portion of the wiring layer is between the substrate and at least one of the first intermediate layer and the second intermediate layer.

2. The display device of claim 1, wherein the wiring layer is on the pixel-defining layer.

3. The display device of claim 2, wherein respective portions of the first opposite electrode and the second opposite electrode overlap corresponding upper surfaces of the wiring layer.

4. The display device of claim 2, wherein an etch selectivity of a material of the wiring layer is different from an etch selectivity of a material of the first pixel electrode and the second pixel electrode.

5. The display device of claim 2, wherein the wiring layer comprises:
  a first metallic layer;
  a second metallic layer overlapping the first metallic layer; and
  a light-transmissive layer between the first metallic layer and the second metallic layer.

6. The display device of claim 1, further comprising:
  a first passivation layer on the first opposite electrode such that the first opposite electrode is between the first passivation layer and the substrate; and
  a second passivation layer on the second opposite electrode such that the second opposite electrode is between the second passivation layer and the substrate.

7. The display device of claim 6, wherein:
  a width of the first passivation layer in a first direction is greater than a width of the first opposite electrode in the first direction, the first passivation layer being spaced apart from the second pixel area;
  a width of the second passivation layer in the first direction is greater than a width of the second opposite electrode in the first direction, the second passivation layer being spaced apart from the first pixel area; and
  thicknesses of the first passivation layer, first opposite electrode, second passivation layer, and the second opposite electrode extend in a second direction crossing the first direction, the second direction being normal to the substrate.

8. The display device of claim 1, wherein the wiring layer comprises a same material as the first pixel electrode and the second pixel electrode.

9. The display device of claim 1, wherein:
  a width of the first opposite electrode in a first direction is greater than a width of the first intermediate layer in the first direction;
  a width of the second opposite electrode in the first direction is greater than a width of the second intermediate layer in the first direction; and
  thicknesses of the first opposite electrode, first intermediate layer, second opposite electrode, and second intermediate layer extend in a second direction crossing the first direction, the second direction being normal to the substrate.

10. The display device of claim 1, wherein at least one of the first intermediate layer and the second intermediate layer further comprises a functional layer on the emission layer.

11. The display device of claim 10, wherein the functional layer comprises one of a hole transport layer, a hole injection layer, an electron injection layer, and an electron transport layer.

12. The display device of claim 1, wherein the first opening region and the second opening region are separated from each other.

13. The display device of claim 1, wherein the first opening region and the second opening region are integrally formed with one another.

14. A display device comprising:
  a substrate comprising a first pixel area and a second pixel area, the first pixel area being spaced apart from the second pixel area by a non-pixel area;
  a first pixel electrode overlapping the first pixel area;
  a second pixel electrode overlapping the second pixel area;
  a pixel-defining layer comprising a first opening overlapping the first pixel electrode and a second opening overlapping the second pixel electrode;
  a first intermediate layer on the first pixel electrode, the first intermediate layer comprising a first emission layer;
  a second intermediate layer on the second pixel electrode, the second intermediate layer comprising a second emission layer spaced apart from the first emission layer;
  a first opposite electrode on the first intermediate layer;
  a second opposite electrode on the second intermediate layer, the second opposite electrode being spaced apart from the first opposite electrode; and
  a wiring layer overlapping the non-pixel area, the wiring layer contacting respective portions of the first opposite electrode and the second opposite electrode, wherein, in a direction normal to the substrate, the wiring layer is between the pixel-defining layer and the substrate, and wherein the pixel-defining layer comprises additional openings exposing the wiring layer.

15. The display device of claim 14, wherein the first opposite electrode and the second opposite electrode contact the wiring layer through corresponding additional openings of the additional openings.

16. A display device comprising:
  a substrate;
  pixel electrodes disposed on the substrate;
  a pixel-defining layer disposed on the substrate, the pixel-defining layer comprising:
    a portion disposed between the pixel electrodes; and
    openings respectively overlapping the pixel electrodes;
  emission layers respectively disposed on the pixel electrodes;
  opposite electrodes respectively disposed on the emission layers, the opposite electrodes being spaced apart from one another; and
  a wiring layer overlapping the portion of the pixel-defining layer, a width of the portion of the pixel-defining layer in a first direction being greater than a width of the wiring layer in the first direction, wherein:
  thicknesses of the pixel-defining layer and the wiring layer extend in a second direction crossing the first direction, the second direction being normal to the substrate; and respective portions of the opposite electrodes overlap corresponding portions of the wiring layer to form electrical connections.

17. The display device of claim 16, wherein widths of the opposite electrodes in the first direction are greater than widths of the emission layers in the first direction.

18. The display device of claim 16, wherein, in the second direction, the pixel-defining layer is disposed between the wiring layer and the substrate.

19. The display device of claim 16, wherein:
the wiring layer is, in the second direction, disposed between the pixel-defining layer and the substrate;
the pixel-defining layer further comprises additional openings exposing the corresponding portions of the wiring layer; and
the respective portions of the opposite electrodes respectively extend into the additional openings to contact the corresponding portions of the wiring layer.

20. The display device of claim 16, further comprising:
passivation layers respectively covering the opposite electrodes,
wherein widths of the passivation layers in the first direction are greater than widths of the opposite electrodes in the first direction.

21. The display device of claim 20, wherein the passivation layers comprise an inorganic insulating material.

22. The display device of claim 21, wherein:
respective portions of the wiring layer respectively overlap corresponding portions of the passivation layers; and
the respective portions of the wiring layer respectively contact the respective portions of the opposite electrodes via respective contact holes.

* * * * *